(12) United States Patent
Kato et al.

(10) Patent No.: US 7,524,689 B2
(45) Date of Patent: Apr. 28, 2009

(54) ACTIVE MATRIX DISPLAY DEVICE AND MANUFACTURING METHOD THEREOF

(75) Inventors: Kiyoshi Kato, Atsugi (JP); Tadafumi Ozaki, Atsugi (JP); Kohei Mutaguchi, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 504 days.

(21) Appl. No.: 11/150,286

(22) Filed: Jun. 13, 2005

(65) Prior Publication Data

US 2005/0227397 A1    Oct. 13, 2005

Related U.S. Application Data

(62) Division of application No. 10/305,980, filed on Nov. 29, 2002, now Pat. No. 6,911,675.

(30) Foreign Application Priority Data

Nov. 30, 2001    (JP) .............................. 2001-367879

(51) Int. Cl.
*H01L 21/00* (2006.01)
*G02F 1/136* (2006.01)

(52) U.S. Cl. .............................. 438/30; 349/42; 349/43

(58) Field of Classification Search .................... 438/30
See application file for complete search history.

(56) References Cited

U.S. PATENT DOCUMENTS

| | | | |
|---|---|---|---|
| 5,064,275 A | 11/1991 | Tsunoda et al. | |
| 5,317,437 A | 5/1994 | Katakura | |
| 5,627,364 A | 5/1997 | Codama et al. | |
| 5,643,826 A | 7/1997 | Ohtani et al. | |
| 5,870,075 A | 2/1999 | Yamazaki et al. | |
| 5,877,831 A | 3/1999 | Leenhouts et al. | |
| 5,897,187 A | 4/1999 | Aoki et al. | |
| 5,923,962 A | 7/1999 | Ohtani et al. | |

(Continued)

FOREIGN PATENT DOCUMENTS

JP    07-183540    7/1995

(Continued)

OTHER PUBLICATIONS

Office Action (Application Serial No. 2002-339235) dated Nov. 25, 2008.

*Primary Examiner*—Ha Tran T Nguyen
*Assistant Examiner*—Valerie Brown
(74) *Attorney, Agent, or Firm*—Eric J. Robinson; Robinson Intellectual Property Law Office, P.C.

(57) ABSTRACT

A semiconductor device reduced in size is provided in which the surface area outside of a display portion required for IC chips to mounted is reduced in a semiconductor device having an active matrix display portion. Further, signal wiring connection defects that accompany IC chip mounting are reduced. By manufacturing TFTs on an opposing substrate in a reflecting active matrix semiconductor device, thus manufacturing a desired logic circuit, the logic circuit, conventionally mounted externally, is formed on the opposing substrate. Further, the semiconductor device is made high speed and high performance by using suitable TFT structures and electric power source voltages for pixels and driver circuits on a pixel substrate and for the logic circuit on the opposing substrate.

16 Claims, 22 Drawing Sheets

U.S. PATENT DOCUMENTS

| | | | |
|---|---|---|---|
| 6,165,824 | A | 12/2000 | Takano et al. |
| 6,256,080 | B1 | 7/2001 | Colgan et al. |
| 6,285,042 | B1 | 9/2001 | Ohtani et al. |
| 6,469,769 | B2 | 10/2002 | Ozaki |
| 6,559,594 | B2 | 5/2003 | Fukunaga et al. |
| 6,613,620 | B2 | 9/2003 | Fujimoto et al. |
| 6,614,076 | B2 | 9/2003 | Kawasaki et al. |
| 6,621,542 | B1 | 9/2003 | Aruga |
| 6,630,907 | B1 | 10/2003 | Ryken et al. |
| 6,649,992 | B2 | 11/2003 | Lim |
| 6,682,963 | B2 | 1/2004 | Ishikawa |
| 6,714,268 | B2 | 3/2004 | Wang et al. |
| 6,956,234 | B2 | 10/2005 | Kato et al. |
| 2001/0033265 | A1* | 10/2001 | Mishima et al. ............... 345/92 |
| 2002/0079484 | A1 | 6/2002 | Yamazaki et al. |
| 2003/0166336 | A1 | 9/2003 | Kato et al. |
| 2004/0095548 | A1 | 5/2004 | Lim et al. |
| 2006/0049405 | A1 | 3/2006 | Kato et al. |

FOREIGN PATENT DOCUMENTS

| | | |
|---|---|---|
| JP | 10-247735 | 9/1998 |
| JP | 2000-292805 | 10/2000 |
| JP | 2001-060067 | 3/2001 |
| JP | 2001-083535 | 3/2001 |
| JP | 2001-102168 | 4/2001 |
| JP | 2001-291666 | 10/2001 |

* cited by examiner

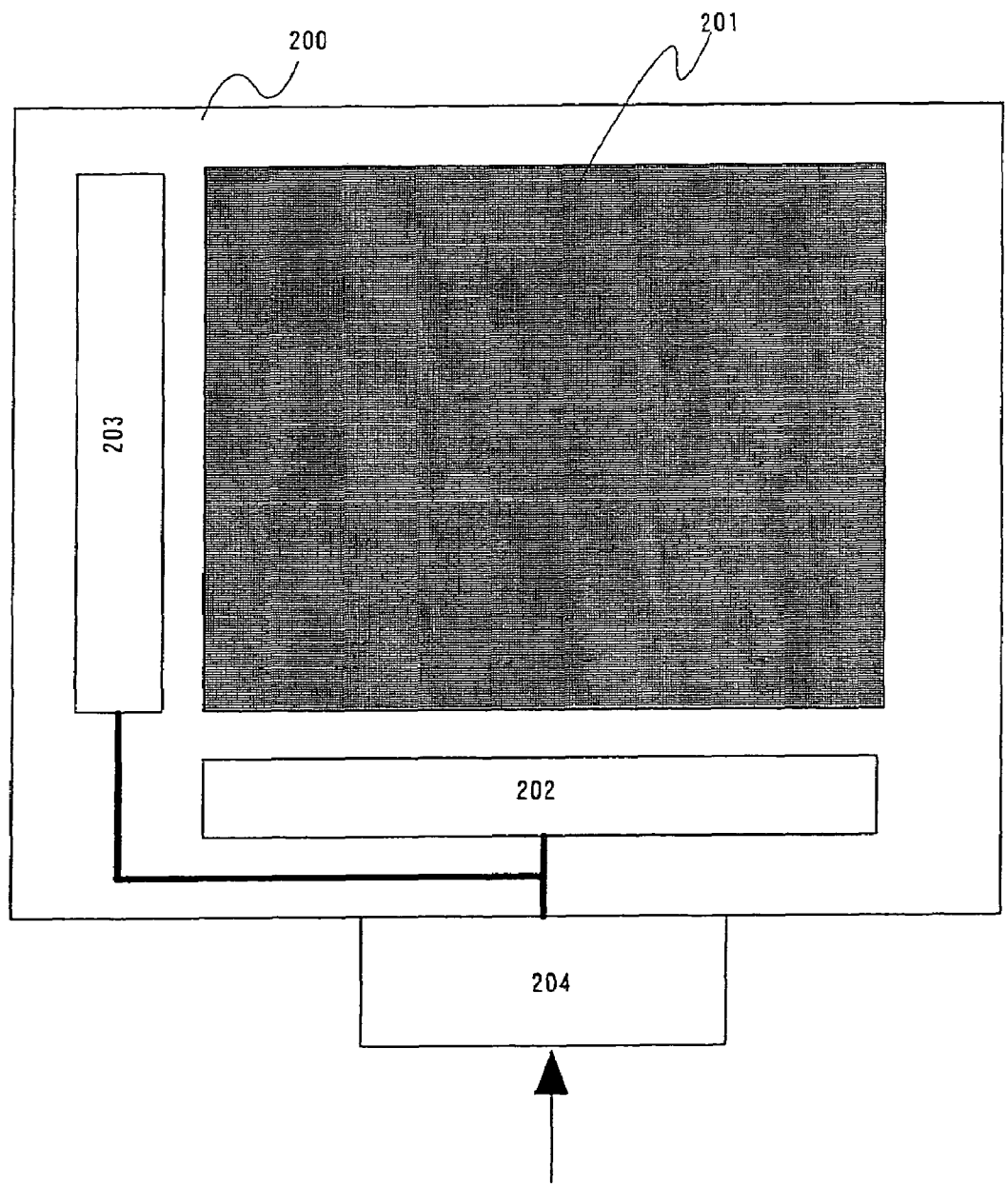

N channel TFT | P channel TFT | pixel TFT(N channel TFT) | holding capacitor driving circuit portion ◄──────► pixel portion relative scanning direction of the laser

FIG. 9
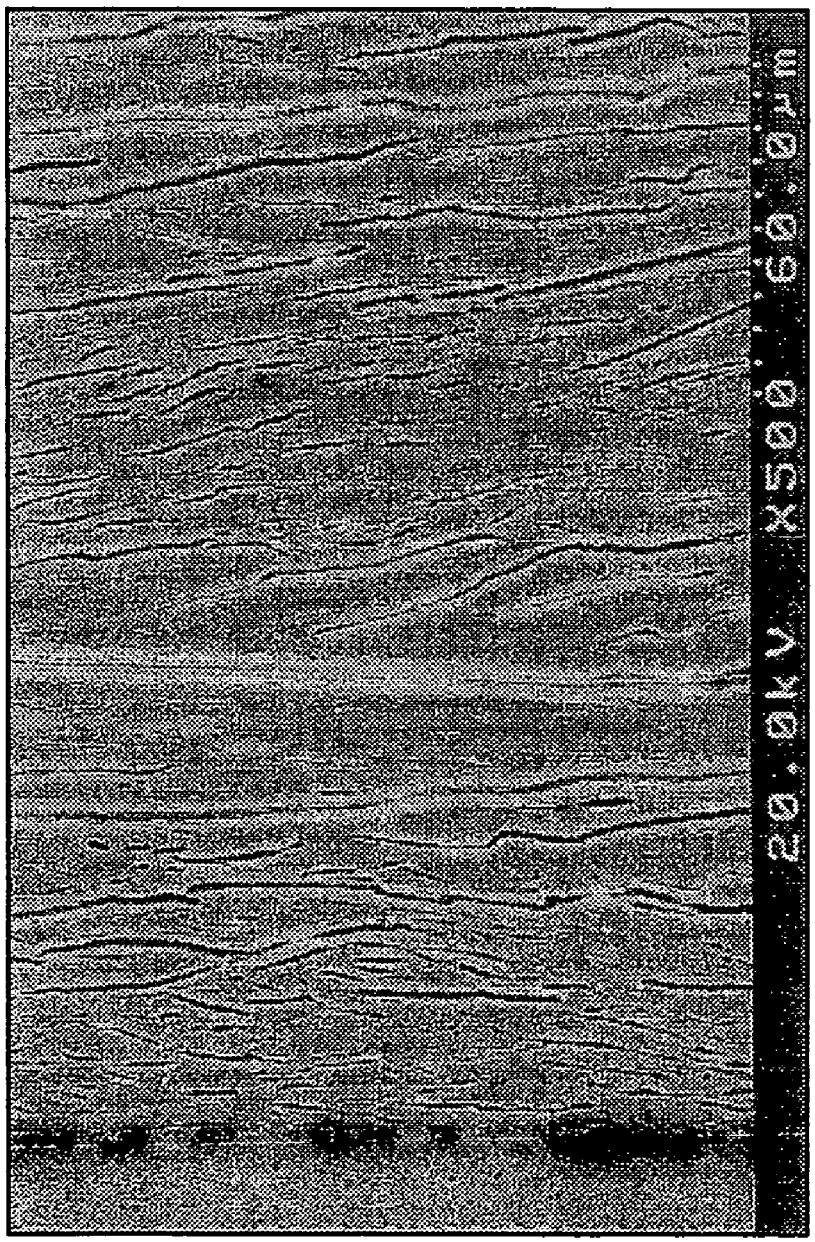
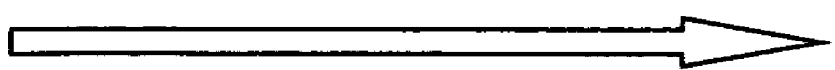
relative scanning direction of the laser

ACTIVE MATRIX DISPLAY DEVICE AND MANUFACTURING METHOD THEREOF

BACKGROUND OF THE INVENTION

1. Field of the Invention

The present invention relates to a semiconductor device in which thin film transistors (hereinafter referred to as TFTs) are formed on a substrate having an insulating surface. In particular, the present invention relates to a liquid crystal display device having an active matrix display portion, an EL display device, and other active matrix display devices.

2. Description of the Related Art

The development of electronic equipment having mounted semiconductor devices therein, in particular semiconductor display devices, has been remarkable in recent years. There are many examples of such applications, including portable equipment like game machines, notebook personal computers, and portable telephones, liquid crystal televisions, liquid crystal displays (liquid crystal display devices), and OLED displays (EL display devices). Semiconductor devices and semiconductor display devices can be made lighter and thinner compared to conventional CRTs, and have a characteristic of low electric power consumption.

Active matrix semiconductor display devices in which TFTs are disposed in a matrix shape in a pixel region, and passive matrix display devices in which stripe shape electrodes are formed crossing each other in a pixel region are known as semiconductor display devices.

With active matrix semiconductor devices, logic circuits other than driver circuits for driving pixels (for example, gate signal line driver circuits and source signal line driver circuits) are formed on a silicon substrate or the like that is separate from a pixel substrate, and mounted externally to the pixel substrate. Note that, although the logic circuits are often mounted externally when using amorphous silicon (non-crystalline silicon films) to form TFT active layers on the pixel substrate, it is also possible to integrally form the logic circuits on the pixel substrate if the active layers are formed using polysilicon (crystalline silicon films).

Note that, within this specification, the term pixel substrate indicates a substrate on which a pixel region is formed. More precisely, the term pixel substrate indicates a substrate on which TFTs (pixel TFTs) disposed in each pixel are formed.

The structure of an active matrix semiconductor display device in which amorphous silicon is used in active layers of TFTs (hereinafter also referred to as amorphous TFTs) is shown in FIG. 4. A gate signal line driver circuit (also referred to as a scanning line driver circuit) 101 and a source signal line driver circuit (also referred to as a signal line driver circuit) 102 are mounted to an FPC 103 by a method such as TAB (tape automated bonding), and externally attached to a substrate (pixel substrate) 104 on which a pixel region 100 is formed. Control signals for the gate signal line driver circuit 101 and the source signal line driver circuit 102 are input from an external portion through the FPC 103.

The structure of an active matrix semiconductor display device in which polysilicon is used in forming active layers of TFTs (hereinafter also referred to as polysilicon TFTs) is shown in FIG. 2. A gate signal line driver circuit 203 and a source signal line driver circuit 202 are formed integrally on a pixel substrate 200. Control signals and image data are input to the gate signal line driver circuit and the source signal line driver circuit from outside through an FPC 204.

An example of an active matrix semiconductor display device having conventional polysilicon TFTs (specifically, a liquid crystal display device) is shown in FIG. 3A. A gate signal line driver circuit 302 and a source signal line driver circuit 303 are formed integrally on a substrate 300 on which a pixel portion 304 is formed. The substrate 300 is connected to a system bus 310 through an interface circuit 305. The substrate 300 and the interface circuit 305 are electrically connected by an FPC 321. In addition, an image processing circuit 306, a VRAM 307, a CPU 311, a memory 308, an interface circuit 309 for communicating to external devices, and the like are also connected to the system bus.

Note that the term VRAM indicates a memory for temporarily storing image data. Further, the term interface circuit denotes a circuit such as a signal format converter or amplifier, through which communication with external devices is performed.

FIG. 3B shows a cross sectional diagram cut along a line segment AB of FIG. 3A. Further, although the pixel region and the gate signal line driver circuit contain a plurality of TFTs, an n-channel TFT forming the pixel region, and an n-channel TFT and a p-channel TFT forming the gate signal line driver circuit are shown here representatively. Furthermore, reflective and transmittive active matrix liquid crystal display devices exist, and a cross sectional diagram of a reflective active matrix liquid crystal display device is shown here.

Liquid crystals 314 are filled into a space surrounded by a glass substrate 312, an opposing substrate 301, and a sealing agent 315. An interlayer insulating film (leveling film) 318 is formed on TFTs formed on the glass substrate, and a reflecting electrode 317 which is electrically connected to a drain electrode of a pixel TFT is formed on the interlayer insulating film 318. An orientation film 319 is formed on the reflective electrode 317. A leveling film 322 is formed first on the opposing substrate, an opposing electrode 313 made from a transparent electrode (ITO) is formed on the leveling film 322, and an orientation film 320 is formed on the opposing electrode 313.

Sunlight, room light, or other external light is reflected by the reflecting electrode 317 as shown by an arrow in FIG. 3B, thus performing screen display.

Logic circuits other than the gate signal line driver circuit and the source signal line driver circuit are formed on a different substrate from the pixel substrate, and then mounted to the aforementioned semiconductor devices, semiconductor display devices, and in addition, electronic equipment in which the semiconductor display devices are installed.

The miniaturization of electronic equipment is a very important issue accompanying the spread of portable electronics, and miniaturization is difficult with the aforementioned structure in which is it necessary to mount a plurality of IC chips, differing from the pixel region. One reason that can be given is that a margin used for mounting is large, even if a logic circuit within an IC chip can be made small.

On the other hand, if an attempt is made to reduce the mounting margin in order to achieve miniaturization, then a high precision mounting technique becomes necessary, and problems in cost and the reliability of the mounted components develop.

SUMMARY OF THE INVENTION

The present invention has been made in view of the above, and an object of the present invention is therefore to provide a semiconductor device and a semiconductor display device capable of being miniaturized. Further, an object of the present invention is to provide a semiconductor device and a semiconductor display device in which connection irregularities that develop when connecting ICs and the like to a substrate are reduced. In addition, an object of the present invention is to provide electronic equipment prepared with the semiconductor display devices of the present invention.

With the present invention, desired logic circuits are manufactured in a semiconductor device, specifically an active matrix semiconductor display device, by forming TFTs on a substrate (hereinafter referred to as an opposing substrate) opposing a substrate on which pixels are formed, thus sandwiching a liquid crystal layer or a light emitting layer.

A structure in which an image is seen from a pixel substrate is used in order to achieve the active matrix semiconductor device. That is, a reflective display method is employed if liquid crystal elements are used, and a bottom emission method is employed for cases in which light emitting elements such as OLED elements are used.

Miniaturization of a semiconductor device having a display portion can be achieved with the present invention by forming logic circuits, conventionally attached externally, on the opposing substrate. Further, it is possible to achieve a narrow frame semiconductor display device with reduced margin. Mounting of ICs and the like can be reduced substantially, and reliability can thus be increased.

Further, the logic circuits structuring the device are formed on the opposing substrate in semiconductor devices of the present invention having a pixel portion, that is, in the semiconductor display device, and therefore a method involving a large capacitance wiring such as an FPC, used when making electrical connections between conventional ICs and pixel substrates, can be avoided. Electric power consumption is thus reduced.

Note that there are many cases in which there are operational speed problems when logic circuits are manufactured by using TFTs on a substrate having an insulating surface, compared with logic circuits formed on a silicon substrate. It is therefore preferable to manufacture TFTs having superior electrical characteristics, in particular electric field effect mobility and threshold voltage, if the logic circuits are manufactured using TFTs formed on a substrate having an insulating surface.

In particular, a method of crystallization or activation of a semiconductor film by using a continuous wave laser may be used if it is necessary to have very high speed TFTs. It becomes possible to manufacture very diverse logic circuits on a substrate having an insulating surface by using a process in which this type of high speed TFT is manufactured, and various types of very small size semiconductor devices can be realized.

Further, pixels (and driver circuits such as source signal line driver circuits and gate signal line driver circuits) and logic circuits are manufactured on separate substrates with the semiconductor device of the present invention, and therefore optimal TFT structures and circuit specifications can be employed for the pixel substrate and the opposing substrate. For example, it is possible to change TFT LDD structures and to change the voltage of electric power supplies by using the pixel substrate and the opposing substrate.

Note that a light blocking film may also be formed in a portion below the pixel TFTs in order to prevent reductions in image quality due to light being incident on pixel TFT active layers.

Note also that the term semiconductor device as used in the present invention indicates devices functioning by utilizing semiconductor characteristics. For example, semiconductor display devices, typically liquid crystal display devices and light emitting devices, and electronic equipment having a semiconductor display portion are included in the category of semiconductor devices. Note that the term semiconductor display portion refers to a display portion in which electrodes or thin film transistors are formed on a substrate having an insulating surface. For example, liquid crystal display portions, light emitting display portion, passive matrix display portions, and active matrix display portions are included in the category of semiconductor display portions. Note that the term semiconductor display portion is also referred to simply as a display portion.

Further, the term logic circuit as used in the present invention indicates all electronic circuits having a specific function and structured by circuit elements such as transistors, capacitive elements, and resistive elements. Resistors, decoders, counters, divider circuits, memories, control circuits, CPUs, and the like are included in the category of logic circuits. Furthermore, the terms electronic circuit and logic circuit are used synonymously.

In particular, logic circuits are formed on substrates having an insulating surface, and therefore TFTs become the main structural elements of the logic circuits. Note that the term TFT includes all transistors formed by using an SOI technique.

Structures of the present invention of this specification are shown below.

According to the present invention, there is provided a semiconductor device comprising: a first substrate having an insulating surface; a second substrate having an insulating surface and opposing the first substrate; a pixel region structured by a plurality of transistors formed on the first substrate; and an electronic circuit structured by a plurality of transistors formed on the second substrate, in which regions for forming the pixel region and the electronic circuit overlap with each other.

According to the present invention, there is provided a semiconductor device comprising: a first substrate having an insulating surface; a second substrate having an insulating surface and opposing the first substrate; a pixel region structured by a plurality of transistors formed on the first substrate; and an electronic circuit and a source signal line driver circuit each structured by a plurality of transistors formed on the second substrate, in which regions for forming the pixel region and the electronic circuit overlap with each other.

According to the present invention, there is provided a semiconductor device comprising: a first substrate having an insulating surface; a second substrate having an insulating surface and opposing the first substrate; a pixel region structured by a plurality of transistors formed on the first substrate; and an electronic circuit and a source signal line driver circuit and gate signal line driver circuit each structured by a plurality of transistors formed on the second substrate, in which regions for forming the pixel region and the electronic circuit overlap with each other.

According to the present invention, there is provided a semiconductor device comprising: a substrate having an insulating surface; a second substrate having an insulating surface and opposing the first substrate; a pixel region and a source signal line driver circuit and gate signal line driver circuit each structured by a plurality of transistors formed on the first substrate; and an electronic circuit structured by a plurality of transistors formed on the second substrate, in which regions for forming the pixel region and the electronic circuit overlap with each other.

Further, a liquid crystal element or a light emitting element may be formed between the first substrate and the second substrate in the present invention.

Further, in the present invention, the transistors formed on the first substrate and the transistors formed on the second substrate may be formed so as to have structures that are symmetric with respect to the liquid crystal element or the light emitting element.

Further, a transparent electrode may be formed on the first substrate, and a reflective electrode may be formed on the second substrate in the present invention.

Further, the first TFT formed on the first substrate has an LDD structure in the present invention. That is, a low concentration impurity region exists between a channel formation region, and a source region and a drain region. A second TFT formed on the second substrate does not have an LDD structure in the present invention. In other words, a channel formation region, and a source region and a drain region may be in contacted with each other.

Further, a first driver voltage for the first TFT formed on the first substrate and a second driver voltage of the second TFT formed on the second substrate may differ in the present invention. In addition, the first driver voltage may be higher than the second driver voltage.

Further, the transistors may be thin film transistors formed on an insulating surface in the present invention.

Further, in the present invention, it is preferable that the active layers of the thin film transistors structuring the electric circuit have crystalline semiconductor films (polycrystalline films).

Further, in the present invention, it is preferable that the active layers of the thin film transistors structuring the electric circuit have crystalline semiconductor films, and the crystalline semiconductor films are obtained by irradiating continuous wave laser light to the semiconductor films, and scanning the laser light unidirectionally with respect to the semiconductor films.

Further, in the present invention, it is preferable that an angle formed between a channel longitudinal direction of the thin film transistors structuring the electronic circuit and a scanning direction of the laser light is from −30° to 30°.

Further, in the present invention, it is preferable that active layers of the thin film transistors structuring the electronic circuit have crystalline semiconductor films and crystal grains structuring the crystalline semiconductor films extend uniaxially.

Further, in the present invention, it is preferable that an angle formed between a channel direction of the thin film transistors structuring the electronic circuit and the uniaxial direction is from −30° to 30°.

Further, in the present invention, the first substrate or the second substrate may be any one of a plastic substrate, a glass substrate, and a quartz substrate.

Further, any one of an SRAM, a DRAM, a frame memory, a timing generator circuit, an image processing circuit, a CPU, a DSP and a mask ROM may be formed on the second substrate in the present invention.

Further, in the present invention, it is preferable that readout time for the SRAM is equal to or less than 200 nsec, readout time for the DRAM is equal to or less than 1 µsec, the operating frequency for the image processing circuit is equal to or greater than 5 MHz, the operating frequency for the CPU is equal to or greater than 5 MHz, and the operating frequency for the DSP is equal to or greater than 5 MHz.

It thus becomes possible to achieve an extremely small size semiconductor device on the same order as the size of a screen, that is, a semiconductor display device in which a frame has been made smaller, by forming only a pixel portion on a pixel substrate and in addition, forming driver circuits and logic circuits on an opposing substrate above the pixel region.

BRIEF DESCRIPTION OF THE DRAWINGS

In the accompanying drawings:

FIG. 2 is a diagram showing a conventional display device in which a gate signal line driver circuit and a source signal line driver circuit are formed on a pixel substrate;

FIG. 9 is a SEM image of a crystalline semiconductor film obtained by the present invention;

DETAILED DESCRIPTION OF THE PREFERRED EMBODIMENTS

Embodiment Mode 1

Figure 1A:
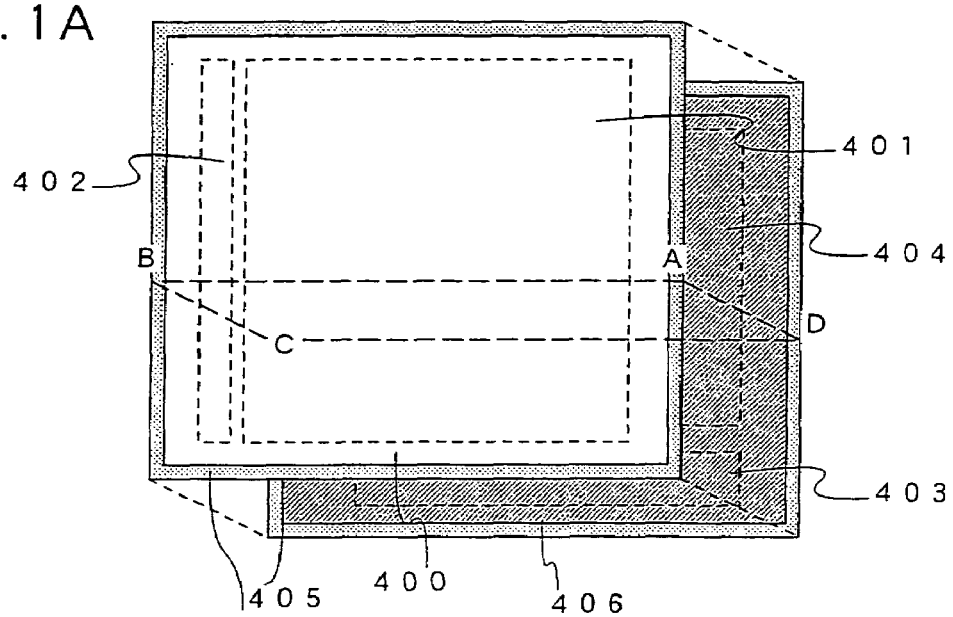
FIGS. 1A to 1C are diagrams showing a semiconductor device having an active matrix display portion of the present invention.
Figure 1B:
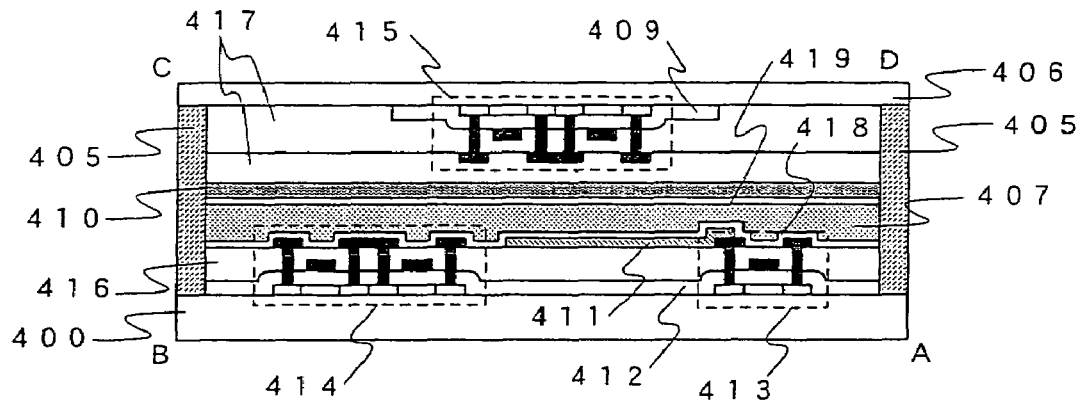
Figure 1C:
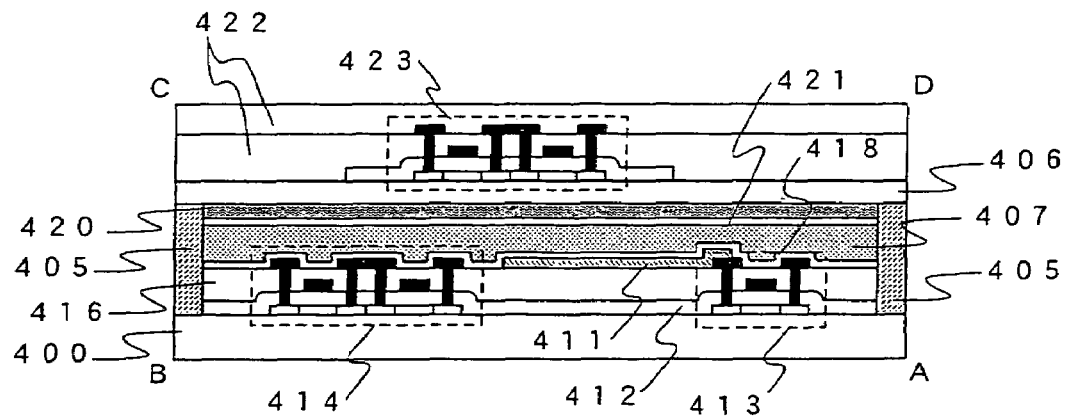
Figure 3A:
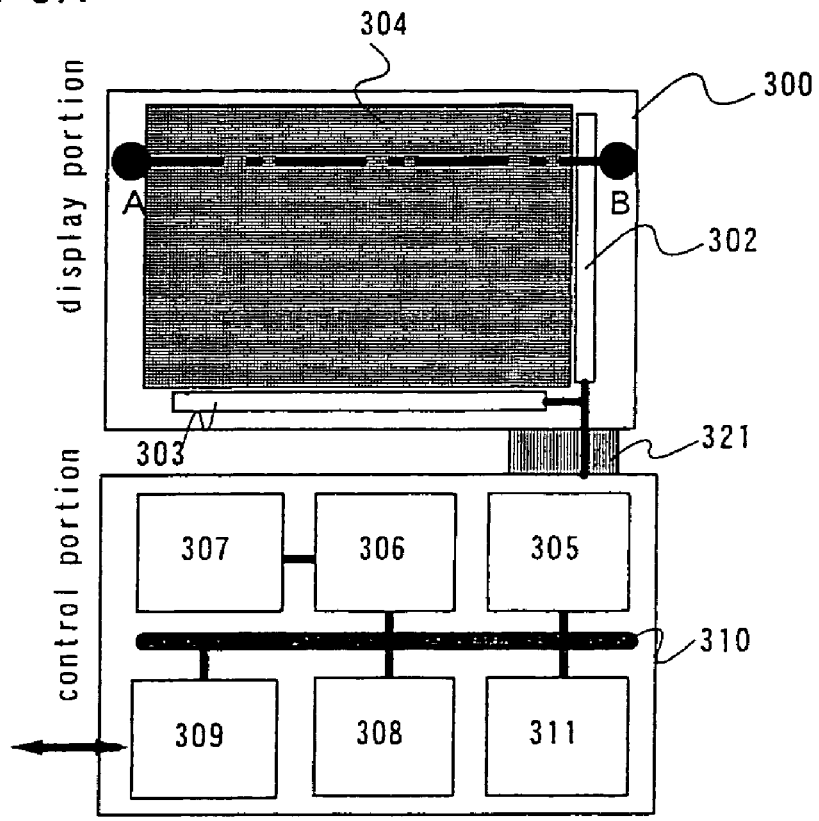
FIGS. 3A and 3B are diagrams showing example of conventional system structures using active matrix semiconductor display devices.
Figure 3B:
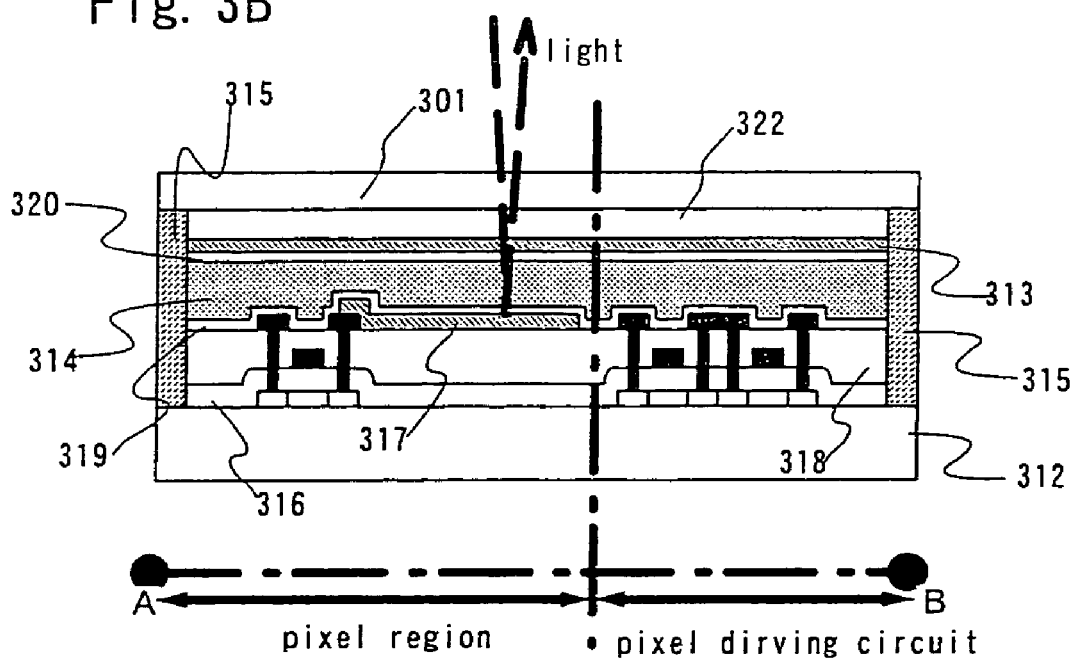
Figure 4:
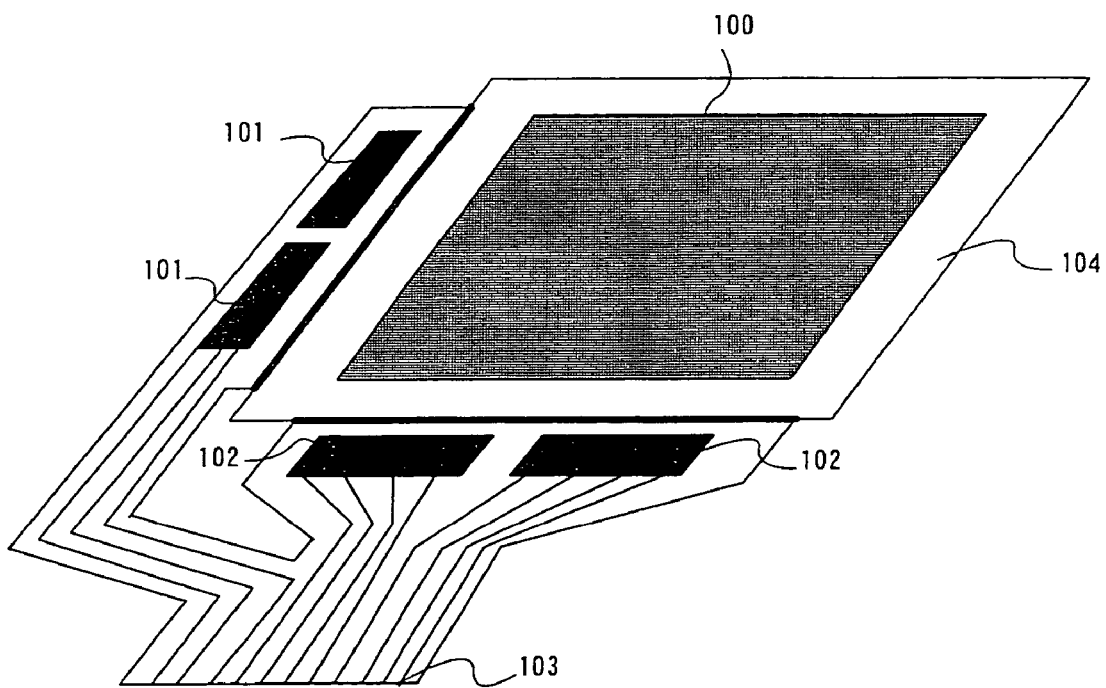
FIG. 4 is a diagram showing a conventional display device in which a gate signal line driver circuit and a source signal line driver circuit are externally attached.

An embodiment mode of a semiconductor device having a display portion of the present invention is explained using FIGS. 1A to 1C.

FIG. 1A is a schematic diagram of a semiconductor device (active matrix semiconductor display device) having an active matrix liquid crystal display portion in which a liquid crystal layer is sandwiched by a glass substrate (pixel substrate) 400 and an opposing substrate 406. A pixel region 401 and a gate signal line driver circuit 402 are formed on the glass substrate 400 in FIG. 1A, and a source signal line driver circuit 403 and a logic circuit 404 are formed on the opposing substrate 406. Further, FIG. 1B is a cross sectional diagram of a surface ABCD of FIG. 1A.

A sealing agent 405 is formed in FIG. 1B so as to surround the pixel region 401 and the gate signal line driver circuit 402 formed on the glass substrate 400, and the source signal line driver circuit 403 and the logic circuit 404 formed on the opposing substrate 406. Liquid crystals 407 fill a space surrounded by the glass substrate (pixel substrate) 400, the sealing agent 405, and the opposing substrate 406.

Further, the pixel region 401, the gate signal line driver circuit 402, the source signal line driver circuit 403, and the logic circuit 404 are structured mainly by a plurality of TFTs. A TFT 414 representing the gate signal line driver circuit, a pixel TFT 413 representing the pixel region, and a TFT 415 representing the source signal line driver circuit and the logic circuit are shown in FIG. 1B.

A p-channel TFT or an n-channel TFT manufactured by a known method may be used in the TFT 414 contained in the gate signal line driver circuit 402 formed on the glass substrate 400 in Embodiment Mode 1, and an n-channel TFT manufactured by a known method is used in the pixel TFT 413.

An interlayer insulating film (leveling film) 416 is formed on the TFT 414 contained in the gate signal line driver circuit 402, and the pixel TFT 413. A pixel electrode 411 electrically connected to a drain of the pixel TFT 413 is formed on the interlayer insulating film 416, and further, an orientation film 418 is formed on top.

The opposing substrate is prepared next.

A p-channel TFT or an n-channel TFT manufactured by using a known method, or if high speed operation is required, formed by a laser crystallization method employing a continuous wave laser, is used for the TFT 415 representing the source signal line driver circuit and the logic circuit formed on the opposing substrate 406. An interlayer insulating film 417 is formed on the TFT 415 formed on the opposing substrate 406.

A reflecting electrode 410 and an orientation film 419 are then formed on the interlayer insulating film 417.

Alternatively, instead of the TFT 415 formed on the opposing substrate 406, a TFT 423 forming the source signal line driver circuit or the logic circuit may be formed in a surface opposite to an upper surface of the opposing substrate (in a surface on a side not contacting liquid crystal materials), as shown in FIG. 1C, and a reflecting electrode 420 and a wiring film 421 may be formed in a portion below the TFT 423. That is, similar to the TFT 413 and the TFT 414, a gate electrode may be formed in a portion above an active layer for the TFT 423, and the reflecting electrode 420 and the wiring film 421 may be formed in a portion below the opposing substrate 406.

The glass substrate 400 and the opposing substrate 406 thus prepared are then bonded by the sealing agent 405. Spacers (not shown in the figures) between the glass substrate 400 and the opposing substrate 406 maintain a fixed gap.

Note that, although not shown in FIGS. 1A to 1C, a color filter or a polarizing plate may also be suitably formed.

A liquid crystal cell having the pixel electrode 411, the liquid crystals 407, and the opposing electrode 410 is thus formed. The desired logic circuit 404 and the source signal line driver circuit 403 are formed on the opposing substrate of the liquid crystal cell in Embodiment Mode 1.

Note that a timing generator, an SRAM, a DRAM, an image processing circuit, an external interface circuit, a CPU, a DSP, a graphic accelerator and the like can be given as examples of the logic circuit 404.

Furthermore, any known method may be used as a method of connecting each of the TFTs and each wiring formed in the opposing substrate and the pixel substrate. For example, they may be connected through an FPC. For cases in which input-output terminals are formed both on the pixel substrate and the opposing substrate on the liquid crystal layer side (for example, the case of FIG. 1B), direct connection may also be made by using an anisotropic conducting film containing a conductive filler, without using an FPC. Further, connections may also be made by wire bonding or the like for cases in which input-output terminals on the opposing substrate are formed on a side opposite that of the liquid crystal layer (for example, the case of FIG. 1C).

Further, input-output terminals for connections to other semiconductor device components from between the opposing substrate and the pixel substrate are formed when necessary, and connections to the other semiconductor components are made through an FPC or the like. The input-output terminals may of course be placed anywhere on the four sides of the substrate 400 and the opposing substrate 406. Furthermore, any known method may be used for the connection method.

An example in which the gate signal line driver circuit and the pixels are formed on the substrate 400, and the source signal line driver circuit and the logic circuit are formed on the opposing substrate 406 is shown in Embodiment Mode 1, but the present invention is not limited to this structure. Both the gate signal line driver circuit and the source signal line driver circuit may also be formed on the glass substrate (pixel substrate) 400, and both the gate signal line driver circuit and the source signal line driver circuit may also be formed on the opposing substrate 406. Alternatively, a structure in which the FPC connecting the glass substrate on which the pixels are formed and the opposing substrate is mounted by TAB may also be used. There are various embodiments for obtaining the semiconductor device and the semiconductor display device of the present invention, but the essence of the present invention is that a driver circuit such as a source signal line driver circuit or a gate signal line driver circuit or an arbitrary logic circuit is formed in an arbitrary region of the opposing substrate.

In particular, it becomes possible to realize an extremely small size semiconductor, on the same order as a screen size, by forming only the pixel region on the pixel substrate and in addition, forming the driver circuits and the logic circuits on the opposing substrate above the pixel region. That is, it becomes possible to achieve a semiconductor display device in which a narrow frame is achieved.

Note that, although examples using a liquid crystal display portion are shown in Embodiment Mode 1 as electronic equipment having a semiconductor display portion (that is, semiconductor display devices), light emitting display portions using elements having a structure in which an organic compound layer that emits light if an electric field develops is sandwiched by an anode and a cathode (for example, OLED elements) as light emitting elements for each pixel may also be employed.

Note that elements utilizing light emission when singlet excitons transition to a base state (fluorescent light) and elements utilizing light emission when triplet excitons transition to a base state (phosphorescent light) are both included as OLED elements.

Further, glass substrates may be used as the pixel substrate and the opposing substrate in Embodiment Mode 1, and plastic substrates capable of withstanding the process temperatures of the TFT manufacturing processes may also be used.

Furthermore, it is also possible to use a top gate structure (planer), a bottom gate structure (reverse stagger) or a dual gate structure having two gate electrodes disposed above and below a channel region, through a gate insulating film, as the TFT structure in Embodiment Mode 1.

The semiconductor device and the semiconductor display device of the present invention are thus characterized in that logic circuits, conventionally formed and mounted on a substrate differing from a substrate structuring a display portion, are formed on an opposing substrate by manufacturing TFTs on the opposing substrate. As a result, a small size semiconductor device and a small size semiconductor display device can be realized, and it becomes possible to greatly simplify mounting of IC chips and the like. Reliability can also be increased from the perspective of mounting.

Embodiment Mode 2

Formation of TFTs on a glass substrate is mainly performed by using amorphous silicon or polysilicon as an active layer. From the standpoint of high speed operation of logic circuits, it is preferable that the TFT electric field mobility be high, and therefore it is preferable that logic circuits be formed by using polysilicon TFTs rather than amorphous TFTs. On the other hand, it is preferable that amorphous TFTs formed by simple processes and at low cost be used for cases in which high speed operation of logic circuits is not necessary.

For example, it is preferable that amorphous TFTs be used provided that the gate signal line driver circuit and the source signal line driver circuit are not formed integrally on a substrate used for forming pixels, while it is preferable that polysilicon TFTs be used if the gate signal line driver circuit and the source signal line driver circuit are formed as integrated on the pixel substrate. As an example of an integral formation, a pixel portion, a source signal line driver circuit, and a gate signal line driver circuit may be formed on a pixel substrate, and a logic circuit may be formed on an opposing substrate. In addition, amorphous silicon and polysilicon may be used as appropriate on the opposing substrate as well by considering operation speed.

In addition, it is preferable to manufacture the TFTs using a process wherein a very high electric field effect mobility can be achieved, when necessary, for cases in which a complex logic circuit is formed. For example, TFTs manufactured by a method of thermally crystallizing a semiconductor film by using a metallic catalyst or a method of crystallizing a semiconductor film by using a continuous emission laser, disclosed in JP 7-183540 A, or a combination of these methods can be used.

Embodiment Mode 3

A semiconductor device of the present invention can employ optimal TFT structures and circuit specification respectively for a pixel substrate and an opposing substrate because pixels and logic circuits are manufactured on different substrates. An embodiment in which the TFT structure and the circuit driver voltage differ between logic circuits on an opposing substrate and logic circuits on a pixel substrate is explained in Embodiment Mode 3.

It is necessary for a pixel region and a driver circuit for driving pixels to use an electric power source voltage that is higher than the voltage required by elements, and therefore a voltage higher than that required by logic circuits is often employed. For example, a voltage on the order of 16 V is needed for a liquid crystal display portion, and a voltage on the order of 12 V becomes necessary for an EL display portion, while an electric power source of between 3 V and 5 V is needed by the logic circuits.

Different electric power source voltages can be selected, depending upon the substrate, with the present invention. For example, an opposing substrate electric power source of 5 V can be used, and a pixel substrate electric power source of 16 V can be used. When considering reliability due to the operating voltage in this case, it is preferable that the TFTs formed on the pixel substrate use a high reliability structure having an LDD (low concentration impurity region between a channel formation region and a source and a drain region) while the TFTs formed on the opposing substrate may be formed in a single drain structure.

Further, the TFTs on the opposing substrate and the TFTs on the pixel substrate can be independently optimized, not only in their gate structures, but also in their active layers and wiring structures.

For example, if the driver frequency for the logic circuit formed on the opposing substrate is higher than the driver frequency necessary for the pixel substrate, then a structure in which TFTs having normal polysilicon active layers (the active layer includes a thin film transistor channel formation region, source region, and drain region) are used on the pixel substrate, and in which TFTs having active layers in which crystallization is performed using a continuous wave laser are used on the opposing substrate is preferable.

Further, it is also possible to use a structure, for example, in which the driver circuits are formed on the opposing substrate, only pixel TFTs are manufactured on the pixel substrate, the TFTs on the pixel substrate use TFTs employing amorphous silicon as their active layers, and the TFTs on the opposing substrate are TFTs having active layers using normal polysilicon, or have active layers in which crystallization is performed using a continuous wave laser.

Furthermore, it is preferable that a one layer metallic wiring structure is used for gate wirings on the pixel electrode, and that a metallic wiring structure having two or more layers be used for gate wirings on the opposing substrate for cases in which the pixel region and the driver circuits are formed on the pixel substrate and a complex logic circuit such as a CPU is formed on the opposing substrate.

Processing speed can be increased, and semiconductor devices and semiconductor display devices can be given higher performance by using optimal TFT structures and optimal electric power source voltages for pixels and driver circuits formed on a pixel substrate, and for logic circuits formed on an opposing substrate.

Embodiment Mode 4

In this specification, a substrate (pixel substrate) on which a driver circuit portion comprised of a CMOS circuit and a pixel region (pixel portion) having a switching TFT and a driver TFT are formed is referred to as an active matrix substrate for the sake of convenience. In this embodiment mode, manufacturing processes of the active matrix substrate and a liquid crystal display device in which the active matrix substrate is embodied are described with reference to FIGS. 5A to 6D.

A quartz substrate formed with an insulating film on its surface is used as a substrate 5000. Further, a plastic substrate having heat-resistance, which can withstand a process temperature in the manufacturing process, may also be used. In this embodiment mode, there is used the substrate 5000 made of glass such as barium borosilicate glass or alumino borosilicate glass.

Figure 5A:
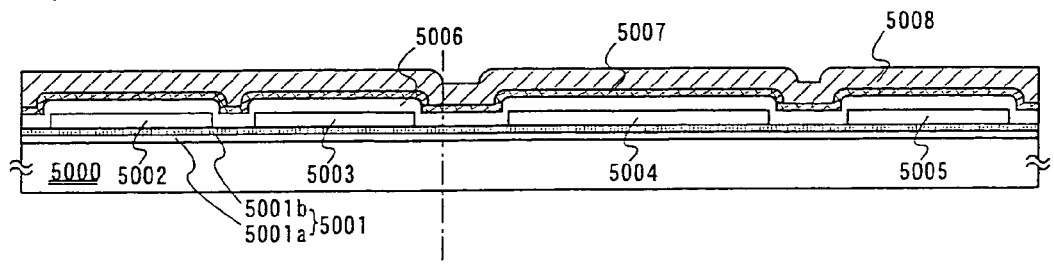
FIGS. 5A to 5D are diagrams showing a process of manufacturing a semiconductor device having a display portion of the present invention.

Next, as shown in FIG. 5A, a base film 5001 comprised of an insulating film such as a silicon oxide film, a silicon nitride film, or a silicon oxynitride film is formed on the substrate 5000. The base film 5001 in this embodiment mode takes a two-layer structure. However, there may be adopted a single layer structure of the insulating film or a structure in which two or more layers of the insulating film are laminated.

In this embodiment mode, as the first layer of the base film 5001, a silicon oxynitride film 5001a is formed from SiH4, NH3, and N2O as a reaction gas to have a thickness of 10 to 200 nm (preferably 50 to 100 nm) by a plasma CVD method. In this embodiment mode, the silicon oxynitride film 5001a is formed with a thickness of 50 nm. Then, as the second layer of the base film 5001, a silicon oxynitride film 5001b is formed from SiH4 and N2O as a reaction gas to have a thickness of 50 to 200 nm (preferably 100 to 150 nm) by the plasma CVD method. In this embodiment mode, the silicon oxynitride film 5001b is formed with a thickness of 100 nm.

Subsequently, semiconductor layers 5002 to 5005 are formed on the base film 5001. As to the semiconductor layers 5002 to 5005, a semiconductor film can be formed with a thickness of 25 to 80 nm (preferably 30 to 60 nm) by a known means (sputtering method, LPCVD method, plasma CVD method, or the like). Then, the semiconductor film can be crystallized by a known crystallization method (laser crystallization method, thermal crystallization method using RTA or furnace annealing, thermal crystallization method using a metal element that promotes crystallization, or the like).

Note that a continuous wave or pulse oscillation type gas laser or solid laser may be used as a laser used in the case where the crystalline semiconductor film is formed by the laser crystallization method. As the former gas laser, an excimer laser, YAG laser, YVO$_4$ laser, YLF laser, YAlO$_3$ laser, glass laser, ruby laser, Ti: sapphire laser, or the like may be used. Also, as the latter solid laser, there may be used a laser which uses crystals such as YAG, YVO$_4$, YLF, or YAlO$_3$ which is doped with Cr, Nd, Er, Ho, Ce, Co, Ti or Tm. A fundamental wave of the laser concerned differs depending on the material to be doped, and the laser light having a fundamental wave of about 1 µm is obtained. A harmonic wave with respect to the fundamental wave can be obtained by using a non-linear optical element. Note that, in crystallization of the amorphous semiconductor film, it is preferable that the solid laser capable of conducting continuous wave is used and that a second harmonic wave to a fourth harmonic wave with respect to the fundamental wave is applied in order to obtain crystals with a large grain size. Typically, the second harmonic wave (532 nm) or third harmonic wave (355 nm) of an Nd:YVO4 laser (fundamental wave of 1064 nm) is applied.

Further, the laser light emitted from the continuous wave type YVO4 laser with an output of 10 W is converted into a harmonic wave by the non-linear optical element. Moreover, there is a method of putting YVO4 crystals and a non-linear optical element into a resonator, thereby emitting a harmonic wave. The harmonic wave is formed into the laser light with a rectangular shape or an elliptical shape on an irradiation surface by an optical system, and the laser light is irradiated to an object to be processed. The energy density at this time needs to be about 0.01 to 100 MW/cm2 (preferably 0.1 to 10 MW/cm2). Then, the semiconductor film is irradiated with the laser light while relatively being moved with respect to the laser light at a speed of about 10 to 2000 cm/s.

Further, in the case where the above laser is used, it is preferable that the laser beam emitted from a laser oscillator is condensed into a linear shape by an optical system to be irradiated to the semiconductor film. The crystallization conditions are appropriately set. However, in the case of using an excimer laser, it is preferable that the pulse oscillation frequency is 300 Hz and the laser energy density is 100 to 700 mJ/cm2 (typically 200 to 300 mJ/cm2). Further, in the case of using a YAG laser, it is preferable that the pulse oscillation frequency is 1 to 300 Hz and the laser energy density is 300 to 1000 mJ/cm2 (typically 350 to 500 mJ/cm2) by using the second harmonic wave. The laser light condensed into a linear shape with a width of 100 to 1000 µm (preferably width of 400 µm) is irradiated to the entire surface of the substrate. The overlap ratio of the linear beam at this time may be 50 to 98%.

In particular, when the laser crystallization is used, the electric field effective mobility of a TFT in which a semiconductor film is formed by using a continuous wave laser as high as that of a TFT using a single crystal semiconductor can be obtained.

Note that an amorphous semiconductor film, a microcrystalline semiconductor film, a crystalline semiconductor film, a compound semiconductor film with an amorphous structure such as an amorphous silicon germanium film, or the like may be used as the semiconductor film.

In this embodiment mode, a 55-nm-thick amorphous silicon film is formed by using the plasma CVD method. Then, a solution containing nickel is applied onto the amorphous silicon film, dehydrogenation (500° C., 1 hour) is performed to the amorphous silicon film, and then, thermal crystallization (550° C., 4 hours) is conducted thereto, thereby forming a crystalline silicon film.

However, in this embodiment mode, since the crystallization of the amorphous silicon film is conducted by using the metal element that promotes crystallization, the metal element remains in the crystalline silicon film. Therefore, an amorphous silicon film with a thickness of 50 to 100 nm is formed on the crystalline silicon film, and heat treatment (thermal annealing using RTA or furnace annealing, or the like) is performed thereto to diffuse the metal element into the amorphous silicon film. After the heat treatment, the amorphous silicon film is removed by conducting etching. As a result, the metal element in the crystalline silicon film can be reduced in content or removed. Thereafter, the semiconductor layers 5002 to 5005 are formed by a patterning process using a photolithography method.

Note that, after the semiconductor layers 5002 to 5005 are formed, doping of a minute amount of impurity element (boron or phosphorous) may be conducted for controlling the threshold value of a TFT.

Subsequently, a gate insulating film 5006 is formed which covers the semiconductor layers 5002 to 5005. The gate insulating film 5006 is formed of an insulating film containing silicon to have a thickness of 40 to 150 nm by using a plasma CVD method or a sputtering method. In this embodiment mode, as the gate insulating film 5006, a silicon oxynitride film is formed with a thickness of 115 nm by the plasma CVD method. Of course, the gate insulating film 5006 is not limited to the silicon oxynitride film, and another insulating film containing silicon may be used in a single layer structure or a laminate structure.

Note that, in the case where a silicon oxide film is used as the gate insulating film 5006, the gate insulating film may be formed such that: TEOS (tetraethyl orthosilicate) and $O_2$ are mixed by the plasma CVD method; a reaction pressure of 40 Pa and a substrate temperature of 300 to 400° C. are set; and an electric discharge is made with a high frequency (13.56 MHz) power density of 0.5 to 0.8 W/cm2. The silicon oxide film formed through the above step can obtain a satisfactory characteristic as the gate insulating film 5006 by subsequent thermal annealing at 400 to 500° C.

Then, on the gate insulating film 5006, a first conductive film 5007 with a thickness of 20 to 100 nm and a second conductive film 5008 with a thickness of 100 to 400 nm are formed in lamination. In this embodiment mode, the first conductive film 5007 comprised of a 30 nm thick TaN film and the second conductive film 5008 comprised of a 370 nm thick W film are formed in lamination.

In this embodiment mode, the TaN film as the first conductive film 5007 is formed using a Ta target in an atmosphere containing nitrogen by a sputtering method. Further, the W film as the second conductive film 5008 is formed using a W target by a sputtering method. In addition, the W film may be formed by a thermal CVD method with the use of tungsten hexafluoride ($WF_6$). In any case, the W film needs to have lower resistance in order to be used for a gate electrode, and the resistivity of the W film is desirably 20 μΩcm or less. The W film can have lower resistance by enlarging the crystal grain. However, in the case where a large amount of impurity element such as oxygen exists in the W film, crystallization is inhibited, which leads to higher resistance. Therefore, the W film is formed with sufficient attention so as not to be mixed with impurities from a vapor phase in film deposition by a sputtering method with the use of a W target with a high purity (purity of 99.9999%). Thus, a resistivity of 9 to 20 μΩcm can be realized.

Note that the TaN film and the W film are used as the first conductive film 5007 and the second conductive film 5008, respectively, in this embodiment mode, but the materials for constituting the first conductive film 5007 and the second conductive film 5008 are not particularly limited. The first conductive film 5007 and the second conductive film 5008 each may be formed from an element selected from the group consisting of Ta, W, Ti, Mo, Al, Cu, Cr and Nd, or an alloy material or compound material which contains the element as a main constituent. Further, the conductive films may be formed of a semiconductor film typified by a polycrystalline silicon film doped with an impurity element such as phosphorous or an AgPdCu alloy.

Figure 5B:
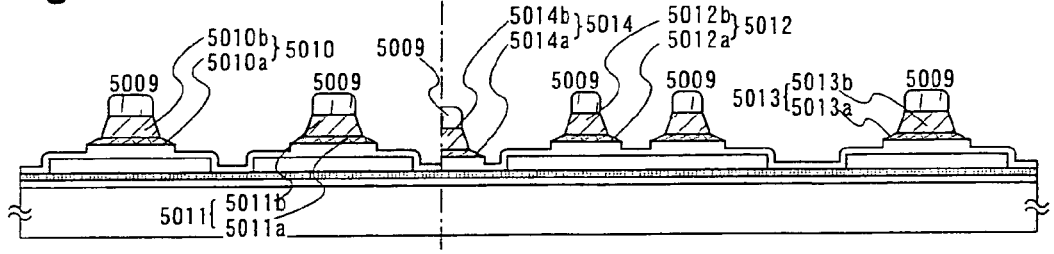
Figure 5C:
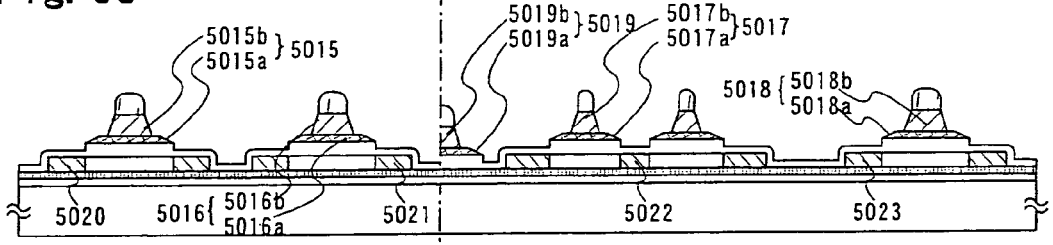

Next, a mask 5009 is formed of resist by using a photolithography method, and a first etching process for forming electrodes and wirings is performed. The first etching process is performed under first and second etching conditions. (FIG. 5B)

In this embodiment mode, as to the first etching conditions, etching is performed by using an ICP (inductively coupled plasma) etching method such that: $CF_4$, $Cl_2$ and $O_2$ are used as an etching gas; the gas flow rate is set to 25:25:10 sccm; and an RF (13.56 MHz) power of 500 W is applied to a coil shape electrode under a pressure of 1.0 Pa to generate plasma. An RF (13.56 MHz) power of 150 W is also applied to the substrate side (sample stage), and a substantially negative self-bias voltage is applied thereto. Then, the W film is etched under the first etching conditions to form end portions of the first conductive film 5007 into a tapered shape.

Subsequently, the first etching conditions are changed into the second etching conditions without removing the mask 5009 made of resist. Etching is performed for about 15 seconds such that: $CF_4$ and $Cl_2$ are used as an etching gas; the gas flow rate is set to 30:30 sccm; and an RF (13.56 MHz) power of 500 W is applied to a coil shape electrode under a pressure of 1.0 Pa to generate plasma. An RF (13.56 MHz) power of 20 W is also applied to the substrate side (sample stage), and a substantially negative self-bias voltage is applied thereto. Under the second etching conditions, both the first conductive layer 5007 and the second conductive layer 5008 are etched to substantially the same level. Note that an etching time may be increased at a rate of about 10 to 20% in order to perform etching without residue on the gate insulating film 5006.

In the first etching process, the mask made of resist is formed into an appropriate shape, whereby the end portions of the first conductive layer 5007 and of the second conductive layer 5008 are formed into a tapered shape due to an effect of the bias voltage applied to the substrate side. In this way, first shape conductive layers 5010 to 5014 that each consist of the first conductive layer 5007 and the second conductive layer 5008 are formed by the first etching process. In the gate insulating film 5006, the regions reduced in thickness are formed because the regions are not covered by the first shape conductive layers 5010 to 5014 and etched by about 20 to 50 nm.

Next, a second etching process is performed without removing the mask 5009 made of resist. (FIG. 5C) In the second etching process, etching is performed for about 25 seconds such that: $SF_6$, $Cl_2$ and $O_2$ are used as an etching gas; the gas flow rate is set to 24:12:24 sccm; an RF (13.56 MHz) power of 700 W is applied to the coil side under a pressure of 1.3 Pa to generate plasma. An RF (13.56 MHz) power of 10 W is also applied to the substrate side (sample stage), and a substantially negative self-bias voltage is applied. In this way, the W film is selectively etched to form second shape conductive layers 5015 to 5019. At this time, first conductive layers 5015*a* to 5019*a* are hardly etched.

Then, a first doping process is performed without removing the mask 5009 made of resist to add an impurity element imparting n-type conductivity to the semiconductor layers 5002 to 5005 at a low concentration. The first doping process may be conducted by an ion doping method or an ion implantation method. As to the conditions of the ion doping method, doping is performed with a dosage of $1\times10^{13}$ to $5\times10^{14}/cm^2$ and an acceleration voltage of 40 to 80 keV. In this embodiment mode, doping is performed with a dosage of $5.0\times10^{14}/cm^2$ and an acceleration voltage of 50 keV. An element belonging to group 15 may be used as the impurity element imparting n-type conductivity. Phosphorous (P) or arsenic (As) is typically used, and phosphorous (P) is used in this embodiment mode. In this case, the second shape conductive layers 5015 to 5019 serve as masks against the impurity element imparting n-type conductivity, and first impurity regions (n⁻regions) 5020 to 5023 are formed in a self-aligning manner. Then, the impurity element imparting n-type conductivity is added to the first impurity regions 5020 to 5023 in a concentration range of $1\times10^{18}$ to $1\times10^{20}/cm^3$.

Subsequently, after the mask 5009 made of resist is removed, a mask 5024 made of resist is newly formed, and a second doping process is performed at an acceleration voltage higher than that in the first doping process. As to the conditions of the ion doping method, doping is performed with a dosage of $1\times10^{13}$ to $3\times10^{15}/cm^2$ and an acceleration voltage of 60 to 120 keV. In this embodiment mode, doping is performed with a dosage of $3.0\times10^{15}/cm^2$ and an acceleration voltage of 65 keV. The second doping process is performed using second conductive layers 5015b to 5019b as masks against the impurity element such that the impurity element is added to the semiconductor layers under the tapered portions of the first conductive layers 5015a to 5019a. Subsequently, a third doping process is performed at an acceleration voltage lower than that in the second doping process. As to the conditions of the ion doping method, doping is performed with a dosage of $1\times10^{15}$ to $3\times10^{17}/cm^2$ and an acceleration voltage of 50 to 100 keV.

Figure 5D:
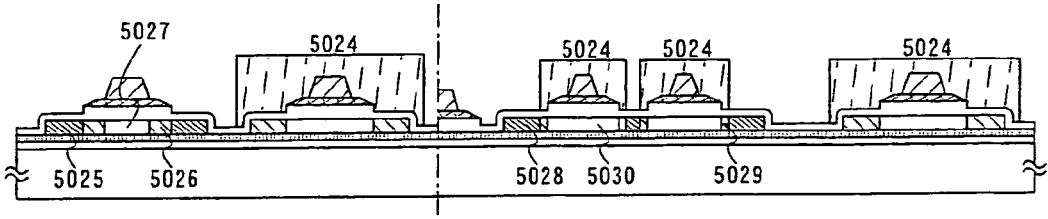

As a result of conducting the second and third doping processes, as shown in FIG. 5D, a second impurity region (n− region, Lov region) 5026 which overlaps the first conductive layer is added with the impurity element imparting n-type conductivity in a concentration range of $1\times10^{18}$ to $5\times10^{19}/cm^3$. Also, third impurity regions (n+ regions) 5025 and 5028 are added with the impurity element imparting n-type conductivity in a concentration range of $1\times10^{19}$ to $5\times10^{21}/cm^3$. Further, after the first and second doping processes, regions to which no impurity element is completely added or regions to which a minute amount of impurity element is added are formed in the semiconductor layers 5002 to 5005. In this embodiment mode, the regions to which no impurity element is added or the regions to which a minute amount of impurity element is added are called channel regions 5027 and 5030. Further, among the first impurity regions (n− regions) 5020 to 5023 formed by the first doping process, a region exists which is covered by the resist 5024 in the second doping process. The region is continuously called a first impurity region (n− region, LDD region) 5029 in this embodiment mode.

Note that the second impurity region (n-region) 5026 and the third impurity regions (n+ regions) 5025 and 5028 are formed by only the second and third doping processes in this embodiment mode, but the present invention is not limited to this. The above regions may be formed by plural doping processes while appropriately changing the doping process conditions.

Figure 6A:
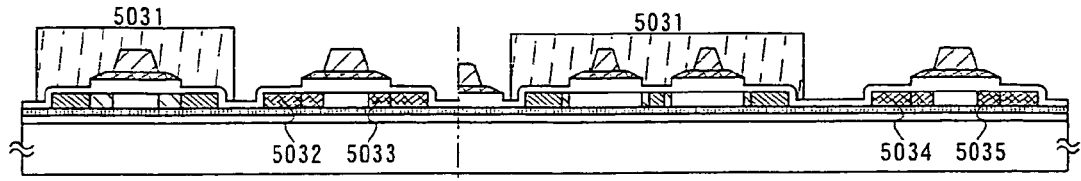
FIGS. 6A to 6D are diagrams showing the process of manufacturing a semiconductor device having a display portion of the present invention.

Then, as shown in FIG. 6A, after the mask 5024 made of resist is removed, a mask 5031 made of resist is newly formed. Thereafter, a fourth doping process is performed. Through the fourth doping process, fourth impurity regions (p+ regions) and fifth impurity regions (p− regions), which are added with an impurity element imparting conductivity opposite to the first conductivity, are formed into the semiconductor layers that serve as active layers of p-channel TFTs. In the fourth doping process of this embodiment mode, an ion doping method using diborane ($B_2H_6$) is used for the formation. As the conditions of the ion doping method, a dosage of $1\times10^{16}$ atoms/$cm^2$ and an acceleration voltage of 80 keV are adopted. Then, the second conductive layers 5016b and 5018b are used as masks against the impurity element. In this way, the impurity element imparting p-type conductivity is added to form the fourth impurity regions (p+ regions) 5032 and 5034 and the fifth impurity regions (p− regions) 5033 and 5035 in a self-aligning manner.

Note that the semiconductor layers for forming n-channel TFTs are covered with the mask 5031 made of resist in the fourth doping process.

Here, by the first to third doping processes, the fourth impurity regions (p+ regions) 5032 and 5034 and the fifth impurity regions (p− regions) 5033 and 5035 have been added with phosphorous at different concentrations. However, any of the fourth impurity regions (p+ regions) 5032 and 5034 and the fifth impurity regions (p− regions) 5033 and 5035 is subjected to the fourth doping process such that the concentration of the impurity element imparting p-type conductivity is $1\times10^{19}$ to $5\times10^{21}/cm^3$. Thus, the fourth impurity regions (p+ regions) 5032 and 5034 and the fifth impurity regions (p− regions) 5033 and 5035 function as source regions and drain regions of the p-channel TFTs without problems.

Note that the fourth impurity regions (p+ regions) 5032 and 5034 and the fifth impurity regions (p− regions) 5033 and 5035 are formed by only the fourth doping process in this embodiment mode, but the present invention is not limited to this. The above regions may be formed by plural doping processes while appropriately changing the doping process conditions.

Figure 6B:
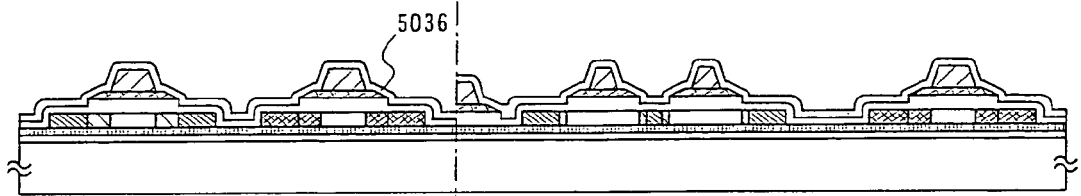

Then, as shown in FIG. 6B, the mask 5031 made of resist is removed, and then, a first interlayer insulating film 5036 is formed. As the first interlayer insulating film 5036, an insulating film containing silicon is formed to have a thickness of 100 to 200 nm by using a plasma CVD method or a sputtering method. In this embodiment mode, a silicon oxynitride film with a thickness of 100 nm is formed by the plasma CVD method. Of course, the first interlayer insulating film 5036 is not limited to the silicon oxynitride film, and another insulating film containing silicon may be used in a single layer or laminate structure.

Figure 6C:
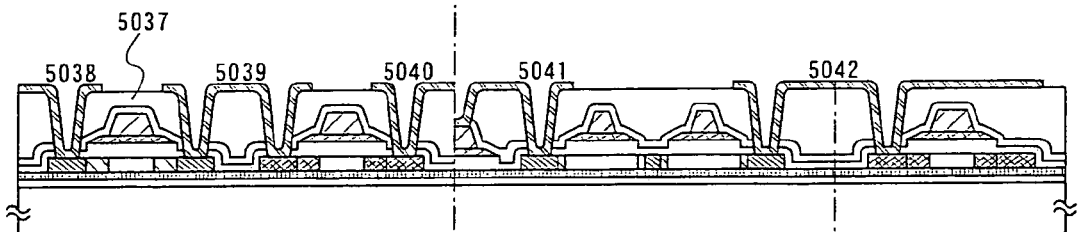

Then, as shown in FIG. 6C, heat treatment (thermal treatment) is conducted to recover the crystallinity of the semiconductor layers and activate the impurity elements added to the semiconductor layers. The heat treatment is conducted by a thermal annealing method using furnace annealing. The thermal annealing method is preferably conducted in a nitrogen atmosphere at an oxygen concentration of 1 ppm or less, preferably 0.1 ppm or less at 400 to 700° C. In this embodiment mode, the activation process is performed by thermal treatment at 410° C. for 1 hour. Note that, in addition to the thermal annealing method, a laser annealing method or a rapid thermal annealing method (RTA method) may be applied.

Further, heat treatment may be performed before the formation of the first interlayer insulating film 5036. Incidentally, in the case where the materials that constitute the first conductive layers 5015a to 5019a and the second conductive layers 5015b to 5019b are easily affected by heat, it is preferable that heat treatment is conducted after the first interlayer insulating film 5036 (insulating film containing silicon as a main constituent, for example, silicon nitride film) is formed in order to protect wirings and the like, as in this embodiment mode.

Heat treatment is conducted after the formation of the first interlayer insulating film 5036 (insulating film containing silicon as a main constituent, for example, silicon nitride film) as described above, whereby hydrogenation of the semiconductor layers can be performed simultaneously with the activation process. In the hydrogenation step, dangling bonds of the semiconductor layers are terminated by hydrogen contained in the first interlayer insulating film 5036.

Note that heat treatment for hydrogenation may be performed in addition to the heat treatment for the activation process.

Here, the semiconductor layers can be hydrogenated irrespective of the existence of the first interlayer insulating film 5036. As another means for hydrogenation, there may be used means with the use of hydrogen excited by plasma (plasma hydrogenation) or means of conducting heat treatment at 300 to 450° C. for 1 to 12 hours in an atmosphere containing 3 to 100% of hydrogen.

Next, a second interlayer insulating film 5037 is formed on the first interlayer insulating film 5036. An inorganic insulating film may be used as the second interlayer insulating film 5037. For example, a silicon oxide film formed by a CVD method, a silicon oxide film applied by an SOG (spin on glass) method, or the like may be used. In addition, as the second interlayer insulating film 5037, an organic insulating film may be used. For example, a film made of polyimide, polyamide, BCB (benzocyclobutene), acrylic, or the like may be used. Further, a laminate structure of an acrylic film and a silicon oxynitride film may also be used.

In this embodiment mode, an acrylic film with a thickness of 1.6 μm is formed. The second interlayer insulating film 5037 can reduce unevenness due to the TFTs formed on the substrate 5000 and provide levelness. Particularly, the second interlayer insulating film 5037 is provided mainly for attaining levelness, and thus is preferably a film excellent in levelness.

Next, the second interlayer insulating film 5037, the first interlayer insulating film 5036, and the gate insulating film 5006 are etched by using dry etching or wet etching, thereby forming contact holes that reach the third impurity regions 5025 and 5028 and the fourth impurity regions 5032 and 5034.

Subsequently, wirings 5038 to 5041 and a pixel electrode 5042, which are electrically connected with the respective impurity regions, are formed. Note that these wirings are formed by patterning a laminate film consisting of a 50 nm thick Ti film and a 500 nm thick alloy film (alloy film of Al and Ti). Of course, the present invention is not limited to a two-layer structure, and a single layer structure or a laminate structure of three or more layers may be adopted. Further, the material for wirings is not limited to Al and Ti. For example, the wirings may be formed by patterning a laminate film in which an Al film or a Cu film is formed on a TaN film, and a Ti film is further formed thereon. In any case, a material excellent in reflecting property is desirably used.

Thereafter, an orientation film 5043 is formed on a portion at least containing the pixel electrode 5042, and a rubbing process is performed thereto. Note that, in this embodiment mode, a columnar spacer 5045 for maintaining a substrate interval is formed at a desired position by patterning an organic resin film such as an acrylic resin film before the orientation film 5043 is formed. Further, a spherical spacer may be scattered over the surface of the substrate instead of the columnar spacer. Further more, a color filter can be formed appropriately before the formation of the orientation film 5043.

Next, a counter substrate 5046 is prepared to form a logic circuit.

A method same as the one in which formations of a base film, a semiconductor layer, a gate insulating film, a first and a second conductive films, processes of a first and a second etching, a first to a fourth doping, and formations of a first and a second interlayer insulating film, a wiring, a conduct hole are conducted in order on the glass substrate 5000, or if necessary, using a semiconductor film formed by the methods shown in the following Embodiment Modes 5 and 6, can be adopted to manufacture TFTs on the counter substrate 5046.

Then, a counter electrode 5051 comprised of a transparent conductive film is formed at least on a portion, which corresponds to a pixel region, of the leveling film 5050, and an orientation film 5052 is formed over the substrate of the counter substrate. Then, a rubbing process is performed thereto.

Figure 6D:
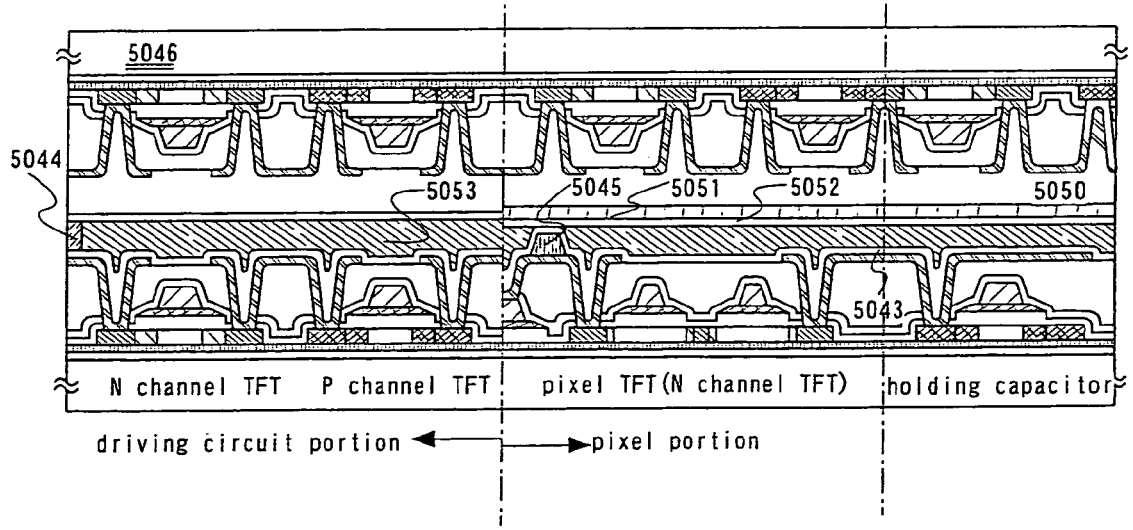

Then, the active matrix substrate on which the pixel region and the driver circuit are formed and the counter substrate are bonded to each other by a sealing material 5044. The sealing material 5044 is mixed with a filler, and the two substrates are bonded while a uniform interval is kept by the filler and the columnar spacer. Thereafter, a liquid crystal material 5053 is injected between both the substrates, and complete sealing is conducted with a sealant (not shown). A known liquid crystal material may be used as the liquid crystal material 5053. Thus, the liquid crystal display device shown in FIG. 6D is completed. Then, if necessary, the active matrix substrate or the counter substrate is cut into a desired shape. Further, a polarizing plate and an FPC (not shown) are bonded to the liquid crystal display device.

In addition, this embodiment mode can be performed by combining with Embodiment Modes 1 and 3.

Embodiment Mode 5

This embodiment mode shows an example of a method for crystallizing a semiconductor film for producing an active layer of TFTs out of a semiconductor included in a semiconductor device or a semiconductor display device of the present invention.

As a base film, a silicon oxynitride film (composition ratio: Si=32%, O=59%, N=7%, and H=2%) in 400 nm thick is formed on a glass substrate by plasma CVD method. Then, as a semiconductor film, 150 nm of amorphous silicon film is formed on the base film by plasma CVD method. Then, thermal processing at 500° C. is performed thereon for three hours so that hydrogen contained in the semiconductor film is discharged. After that, the semiconductor film is crystallized by laser annealing method.

As the laser used for laser annealing method, continuous wave $YVO_4$ laser is used. For the laser annealing method, the second harmonic (wavelength 532 nm) of the $YVO_4$ laser is used as laser light. As the beam in a predetermined form, laser light is irradiated to the semiconductor film formed on the substrate surface by using an optical system.

The form of the beam irradiated to the substrate can be varied depending on the type of laser or optical system. In this way, the aspect ratio and/or distribution of energy density of the beam irradiated onto the substrate can be changed. For example, various forms of the beam irradiated onto the substrate are possible such as linear, rectangular and elliptical forms. In this embodiment mode, the second harmonic of the $YVO_4$ laser in an elliptical form of 200 μm×50 μm is irradiated to the semiconductor film by using an optical system.

Figure 7:
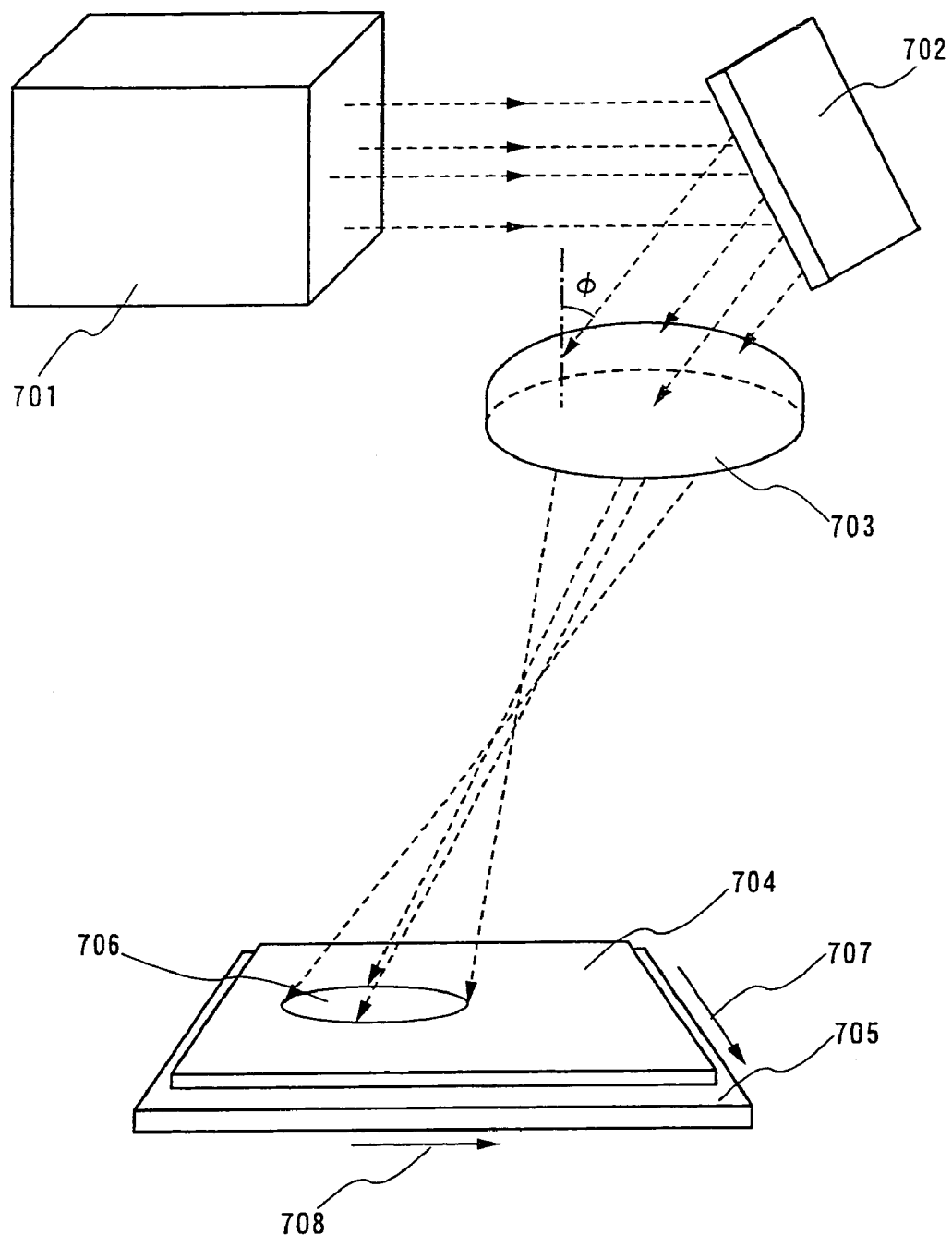
FIG. 7 is a schematic diagram of an optical system for use during laser irradiation.

FIG. 7 shows a model diagram of an optical system, which is used when laser light is irradiated to a semiconductor film on a substrate surface.

Laser light (the second harmonic of $YVO_4$ laser) emitted from a laser 701 enters a convex lens 703 through a mirror 702. The laser light enters to the convex lens 703 diagonally. As a result, a focus position is shifted due to the aberration such as astigmatism. Thus, elliptical beam 706 can be formed in an irradiated surface or near there.

Then, the elliptical beam 706 formed in this way is irradiated, and a glass substrate 705 is moved in a direction indicated by a reference numeral 707 or 708. Then, in the semiconductor film 704 formed on the glass substrate 705, the elliptical beam 706 is irradiated by relatively being moved.

The relative scanning direction of the elliptical beam 706 is perpendicular to the major axis of the elliptical beam 706.

In this embodiment mode, the elliptical beam of 200 μm×50 μm is formed having incident angle φ of about 20° of laser light with respect to the convex lens 703. The elliptical beam is irradiated on the glass substrate 705 by being moved at the speed of 50 cm/s. Thus, the semiconductor film is crystallized.

Figure 8:
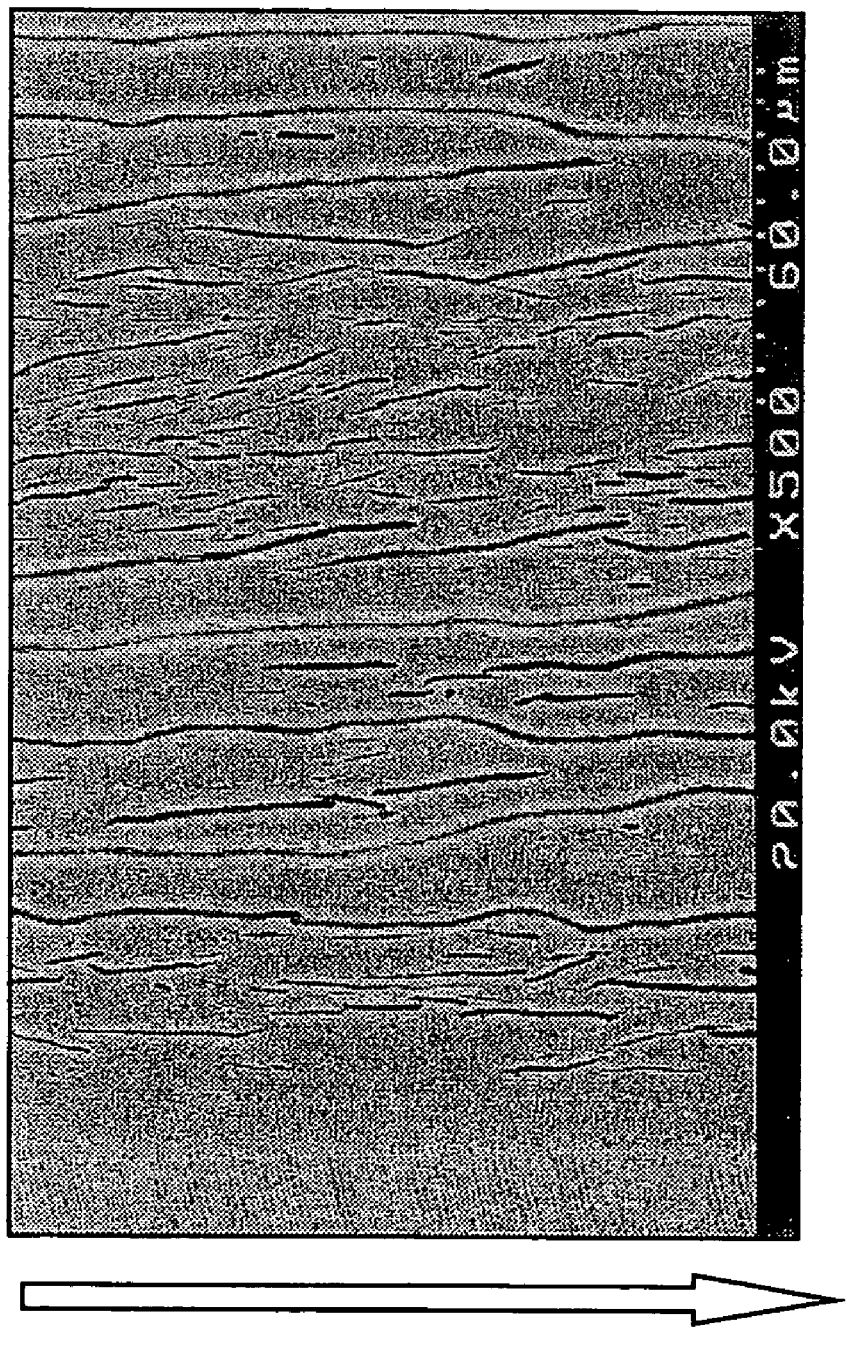
FIG. 8 is a SEM image of a crystalline semiconductor film obtained by the present invention.

The seco etching is performed on the crystalline semiconductor film obtained in this way. FIG. 8 shows the result of the observation of the surface by using an SEM with 500 magnifications. The seco solution used for the seco etching is manufactured by adding $K_2Cr_2O_7$ as additive to $HF:H_2O=2:1$. One shown in FIG. 8 is obtained by relatively scanning laser light in a direction indicated by an arrow shown in FIG. 8. Large crystal grains are formed in parallel with the scanning direction of the laser light. In other words, the crystal is raised so as to extend in the scanning direction of the laser light.

In this way, large crystal grains are formed on the crystallized semiconductor film by using the method according to this embodiment mode. Therefore, when the semiconductor film is used as a semiconductor active layer to manufacture a TFT, the number of the crystal grain boundaries included in the channel forming area of the TFT can be reduced. In addition, each crystal grain internally has crystallinity, which is essentially single crystal. Therefore, the mobility (field effect mobility) as high as that of a transistor using a single crystal semiconductor can be obtained.

Furthermore, when the TFT is positioned such that the direction that the carrier moves can be the same as the direction that the formed crystal grains extend, the number of times that the carriers cross the crystal grain boundary can be extremely reduced. Therefore, a variation in ON current value (value of drain current flowing when the TFT is ON), an OFF current value (value of drain current flowing when the TFT is OFF), a threshold voltage, an S-value and field effect mobility can be reduced. As a result, the electric characteristic can be improved significantly.

In order to irradiate the elliptical beam 706 in a wide range of the semiconductor film, the elliptical beam 706 is scanned in a direction perpendicular to the major axis to irradiate to the semiconductor film multiple times. Here, the position of the elliptical beam 706 is shifted in the direction parallel to the major axis for every single scan. The scanning direction becomes opposite between serial scans. In the serial two scans, one will be called outward scan and the other will be called inward scan hereinafter.

The amount of shifting the position of the elliptical beam 706 to the direction parallel to the major axis for every single scan is expressed by pitch d. A reference numeral D1 indicates, in the outward scan, the length of the elliptical beam 706 in the direction perpendicular to the scanning direction of the elliptical beam 706 in an area having large crystal grains as shown in FIG. 8. A reference numeral D2 indicates, in the inward scan, the length of the elliptical beam 706 in the direction perpendicular to the scanning direction of the elliptical beam 706 in an area having large crystal grains as shown in FIG. 11. In this case, an average value of D1 and D2 is D.

Here, an overlap ratio $R_{OL}$ [%] is defined by Equation 1.

$$R_{OL}=(1-d/D)\times 100 \quad \text{[Equation 1]}$$

In this embodiment mode, the overlap ratio $R_{OL}$ is 0%.

Embodiment Mode 6

This embodiment mode is different from Embodiment Mode 5 in the method for crystallizing a semiconductor film when an active layer of TFTs out of a semiconductor included in a semiconductor device or a semiconductor display device of the present invention is manufactured.

The steps up to forming an amorphous silicon film as a semiconductor film are the same as those of Embodiment Mode 5. After that, the method disclosed in Japanese Patent Application Laid-open No. Hei 7-183540 is used. Nickel acetate solution (5 ppm in weight conversion concentration and 10 ml in volume) is coated on the semiconductor film by spin coating method. Then, thermal processing is performed thereon in a nitrogen atmosphere at 500° C. for one hour and in a nitrogen atmosphere at 550° C. for twelve hours. Then, the crystallinity of the semiconductor film is improved by laser annealing method.

As the laser used for laser annealing method, continuous wave $YVO_4$ laser is used. For the laser annealing method, the second harmonic (wavelength 532 nm) of the $YVO_4$ laser is used as laser light. The elliptical beam of 200 μm×50 μm is formed having incident angle φ of about 20° of laser light with respect to the convex lens 703 in the optical system shown in FIG. 7. The elliptical beam is moved and irradiated to the glass substrate 705 at the speed of 50 cm/s. Thus, the crystallinity of the semiconductor film is improved.

The relative scanning direction of the elliptical beam 706 is perpendicular to the major axis of the elliptical beam 706.

The seco etching is performed on the crystalline semiconductor film obtained in this way. FIG. 9 shows the result of the observation of the surface by using an SEM with 500 magnifications. One shown in FIG. 9 is obtained by relatively scanning laser light in a direction indicated by an arrow shown in FIG. 9. Large crystal grains extend in the scanning direction.

In this way, large crystal grains are formed on the crystallized semiconductor film according to this embodiment mode. Therefore, when the semiconductor film is used to manufacture a TFT, the number of the crystal grain boundaries included in the channel forming area of the TFT can be reduced. In addition, each crystal grain internally has crystallinity, which is essentially single crystal. Therefore, the mobility (field effect mobility) as high as that of a transistor using a single crystal semiconductor can be obtained.

Furthermore, the formed crystal grains are aligned in one direction. Thus, when the TFT is positioned such that the direction that the carriers move can be the same as the direction that the formed crystal grains extend, the number of times that the carriers cross the crystal grain boundary can be extremely reduced. Therefore, a variation in ON current value, an OFF current value, a threshold voltage, an S-value and field effect mobility can be reduced. As a result, the electric characteristic can be improved significantly.

In order to irradiate the elliptical beam 706 in a wide range of the semiconductor film, the elliptical beam 706 is scanned in a direction perpendicular to the major axis to irradiate to the semiconductor film multiple times (this operation may be called scan). Here, the position of the elliptical beam 706 is shifted in the direction parallel to the major axis for every single scan. The scanning direction becomes opposite between continuous scans. Namely, just like in Embodiment Mode 5, in the continuous two scans, one will be called outward scan and the other will be called inward scan hereinafter.

The amount of shifting the position of the elliptical beam 706 to the direction parallel to the major axis for every single scan is expressed by pitch d. A reference numeral D1 indicates, in the outward scan, the length of the elliptical beam 706 in the direction perpendicular to the scanning direction of the elliptical beam 706 in an area having large crystal grains as shown in FIG. 9. A reference numeral D2 indicates, in the inward scan, the length of the elliptical beam 706 in the direction perpendicular to the scanning direction of the elliptical beam 706 in an area having large crystal grains as shown in FIG. 9. In this case, an average value of D1 and D2 is D.

Here, an overlap ratio $R_{O.L.}$ [%] is defined like Equation 1. In this embodiment mode, the overlap ratio $R_{O.L.}$ is 0%.

Figure 10:
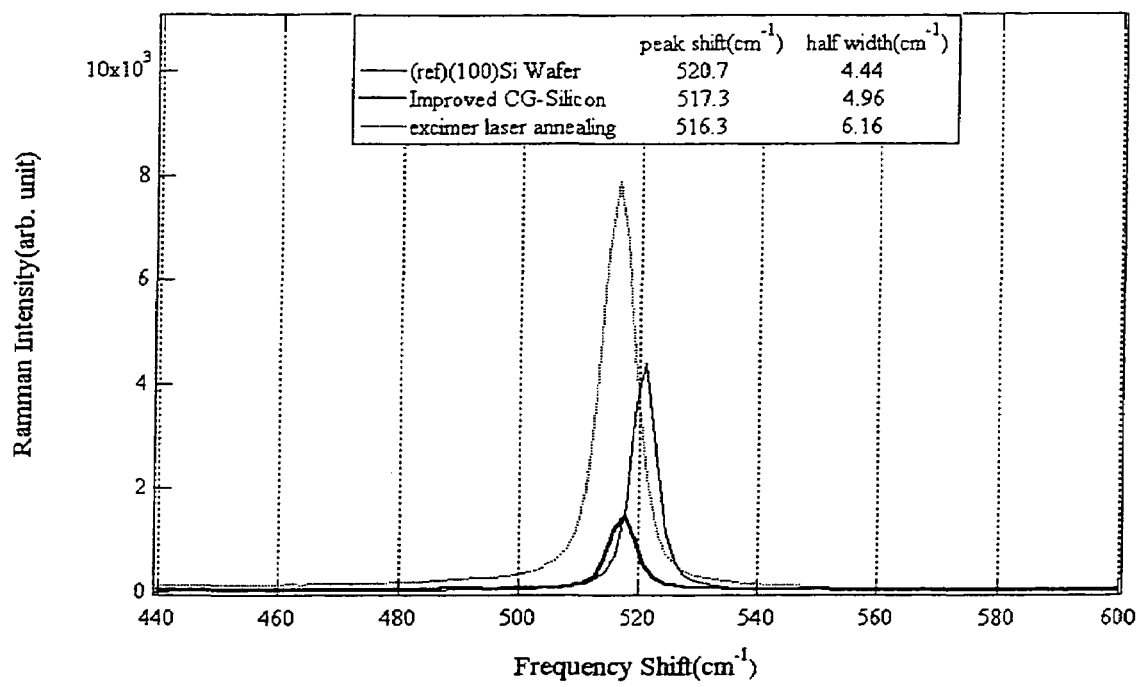
FIG. 10 is a Raman spectrum of a semiconductor film obtained by the present invention.

In FIG. 10, a thick line indicates a result of Raman spectroscopy performed on the crystalline semiconductor film (represented by Improved CG-Silicon in FIG. 10) obtained by using the above-described crystallization method. Here, for comparison, a thin line indicates a result of Raman spectroscopy performed on the single crystal silicon (represented by ref. (100) Si Wafer in FIG. 10). In FIG. 10, a dotted line indicates a result of Raman spectroscopy performed on a semiconductor film (represented by excimer laser annealing in FIG. 10). In order to obtain the semiconductor film, an amorphous silicon film is formed and hydrogen contained in the semiconductor film is discharged through thermal processing. Then, the semiconductor film is crystallized by using excimer laser with pulse oscillation.

The Raman shift of the semiconductor film obtained by using the method of this embodiment mode has the peak at 517.3 cm$^{-1}$. The half value breadth is 4.96 cm$^{-1}$. On the other hand, the Raman shift of the single crystal silicon has the peak at 520.7 cm$^{-1}$. The half value breadth is 4.44 cm$^{-1}$. The Raman shift of the semiconductor film crystallized by using the excimer laser with the pulse oscillation has the peak at 516.3 cm$^{-1}$. The half value breadth is 6.16 cm$^{-1}$.

From the results in FIG. 10, the crystallinity of the semiconductor film obtained by using the crystallization method described in this embodiment mode is closer to that of the single crystal silicon than the crystallinity of the semiconductor film crystallized by using the excimer laser with pulse oscillation.

Embodiment Mode 7

In this embodiment mode, a case where a semiconductor film crystallized by using the method described in Embodiment Mode 5 is used to manufacture a TFT will be described with reference to FIGS. 11A to 11H, further, electric characteristics the TFT will be described with reference to FIGS. 12A to 12B.

Figure 11A:
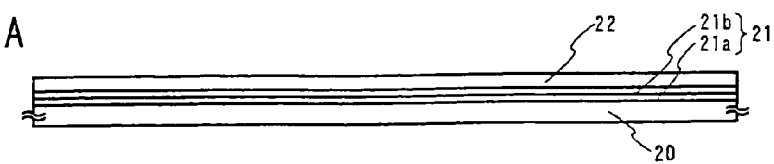
FIGS. 11A to 11H are a process of manufacturing a TFT using a semiconductor film obtained in accordance with the present invention.

A glass substrate is used as a substrate 20 in this embodiment mode. As a base film 21, 50 nm of silicon oxynitride film (composition ratio Si=32%, O=27%, N=24%, and H=17%) and 100 nm of silicon oxynitride film (composition ratio Si=32%, O=59%, N=7%, and H=2%) are stacked on the glass substrate by plasma CVD method. Next, as a semiconductor film 22, 150 nm of amorphous silicon film is formed on the base film 21 by plasma CVD method. Then, thermal processing is performed thereon at 500° C. for three hours to discharge hydrogen contained in the semiconductor film (FIG. 11A).

Figure 11B:
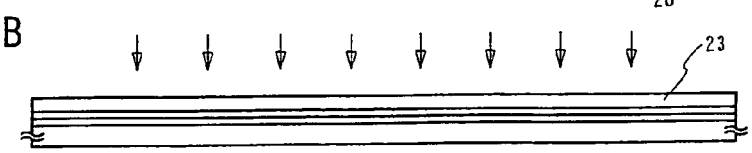

After that, the second harmonic (wavelength 532 nm, 5.5 W) of the continuous wave YVO$_4$ laser is used as the laser light to form an elliptical beam of 200 μm×50 μm having incident angle φ of about 20° of laser light with respect to the convex lens 703 in the optical system shown in FIG. 7. The elliptical beam is irradiated on the semiconductor film 23 by relatively being scanned at the speed of 50 cm/s (FIG. 11B).

Figure 11C:
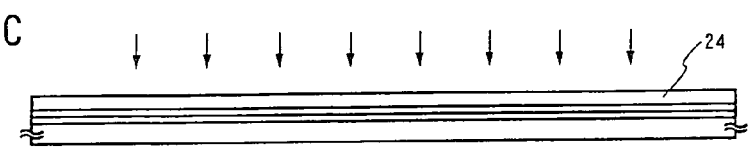

Then, first doping processing is performed thereon. This is channel doping for controlling the threshold value. B$_2$H$_6$ is used as material gas having a gas flow amount of 30 sccm, a current density of 0.05 μA, an accelerating voltage of 60 keV, and a dosage of 1×10$^{14}$/cm$^2$ (FIG. 11C).

Figure 11D:
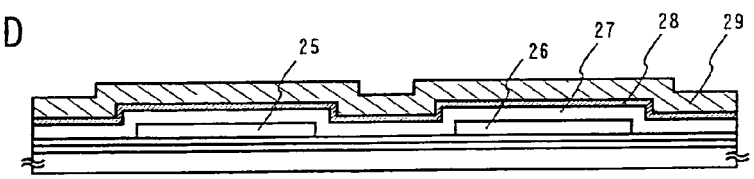

Next, after etching the semiconductor film 24 into a desired form by patterning, a silicon oxynitride film in 115 nm thick is formed by plasma CVD method as a gate insulating film 27 covering the etched semiconductor film. Then, a TaN film 28 in 30 nm thick and a W film 29 in 370 nm thick are stacked on the gate insulating film 27 as a conductive film (FIG. 11D).

A mask (not shown) made of resist is formed thereon by using photolithography method, and the W film, the TaN film and the gate insulating film are etched.

Figure 11E:
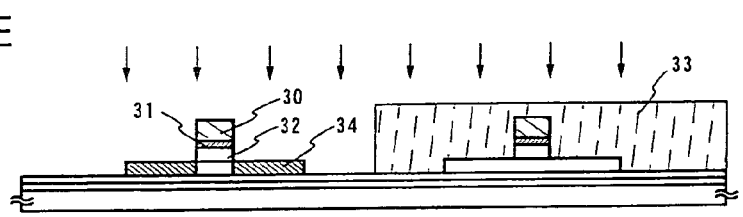

Then, the mask made of resist is removed, and a new mask 33 is formed. The second doping processing is performed thereon and an impurity element imparting the n-type to the semiconductor film is introduced. In this case, the conductive layers 30 and 31 are masks for the impurity element imparting the n-type, and an impurity region 34 is formed in a self-aligned manner. In this embodiment mode, the second doping processing is performed under two conditions because the semiconductor film is thick as much as 150 nm. In this embodiment mode, phosfin (PH$_3$) is used as material gas (base material gas). The dosage of 2×10$^{13}$/cm$^2$ and the accelerating voltage of 90 keV are used, and then the dosage of 5×10$^{14}$/cm$^2$ and the accelerating voltage of 10 keV are used for the processing (FIG. 11E).

Figure 11F:
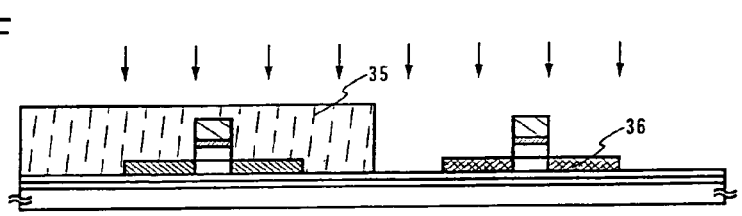

Next, the mask 33 made of resist is removed, and a new mask 35 made of resist is formed additionally for performing the third doping processing. Through the third doping processing, an impurity region 36 is formed containing an impurity element for imparting the opposite conductive type against the one conductive type to the semiconductor film, which is an active layer of a p-channel TFT. By using the conductive layers 30 and 31 as a mask for the impurity element, the impurity region 36 is formed in the self-aligned manner by addition of the impurity element for imparting the p-type. Also the third doping processing in this embodiment mode is performed under two conditions because the semiconductor film is thick as much as 150 nm. In this embodiment mode, diborane (B$_2$H$_6$) is used as material gas. The dosage of 2×10$^{13}$/cm$^2$ and the accelerating voltage of 90 keV are used, and then the dose amount of 1×10$^{15}$/cm$^2$ and the accelerating voltage of 10 keV are used for the processing (FIG. 11F).

Through these steps, the impurity regions 34 and 36 are formed on the respective semiconductor layers.

Next, the mask 35 made of resist is removed, and silicon oxynitride film (composition ratio Si=32.8%, O=63.7%, and N=3.5%) in 50 nm thick is formed as a first interlayer insulating film 37 by plasma CVD method.

Figure 11G:
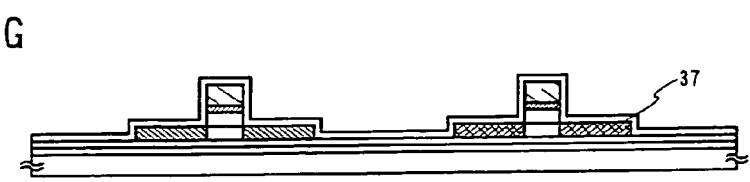

Next, thermal processing is performed thereon to recover crystallinity of the semiconductor layers and to activate the impurity elements added to the semiconductor layers, respectively. Then, thermal processing by thermal annealing method using an anneal furnace is performed at 550° C. for four hours in a nitrogen atmosphere (FIG. 11G).

Next, a second interlayer insulating film 38 of an inorganic or organic insulating material is formed on the first interlayer insulating film 37. In this embodiment mode, after forming a silicon nitride film in 50 nm thick by CVD method, a silicon oxide film in 400 nm thick is formed.

After the thermal processing, hydrogenation processing can be performed. In this embodiment mode, the thermal processing is performed at 410° C. for one hour in a nitrogen atmosphere by using an anneal furnace.

Figure 11H:
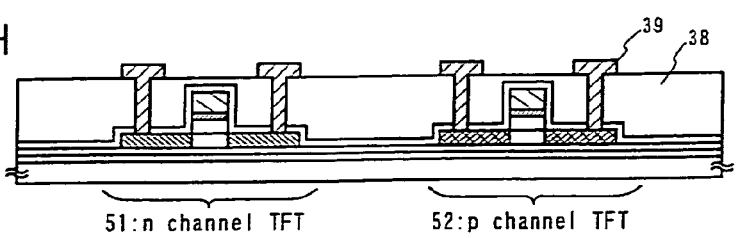

Next, a wiring 39 is formed for connecting to the impurity regions electrically. In this embodiment mode, the wiring 2019 is formed by patterning a laminate film of a Ti film in 50 nm thick, an Al—Si film in 500 nm thick and a Ti film in 50 nm thick. Naturally, the construction is not limited to the two-layer construction, but may be a single layer construction or a laminate construction having three or more layers. The material of the wiring is not limited to Al and Ti. For example, Al and/or Cu may be formed on a TaN film. Then, a laminate film having a Ti film may be patterned to form a wiring (FIG. 11H).

In this way, the n-channel TFT 51 and the p-channel TFT 52 are formed, both having the channel length of 6 μm and the channel width of 4 μm.

Figure 12:
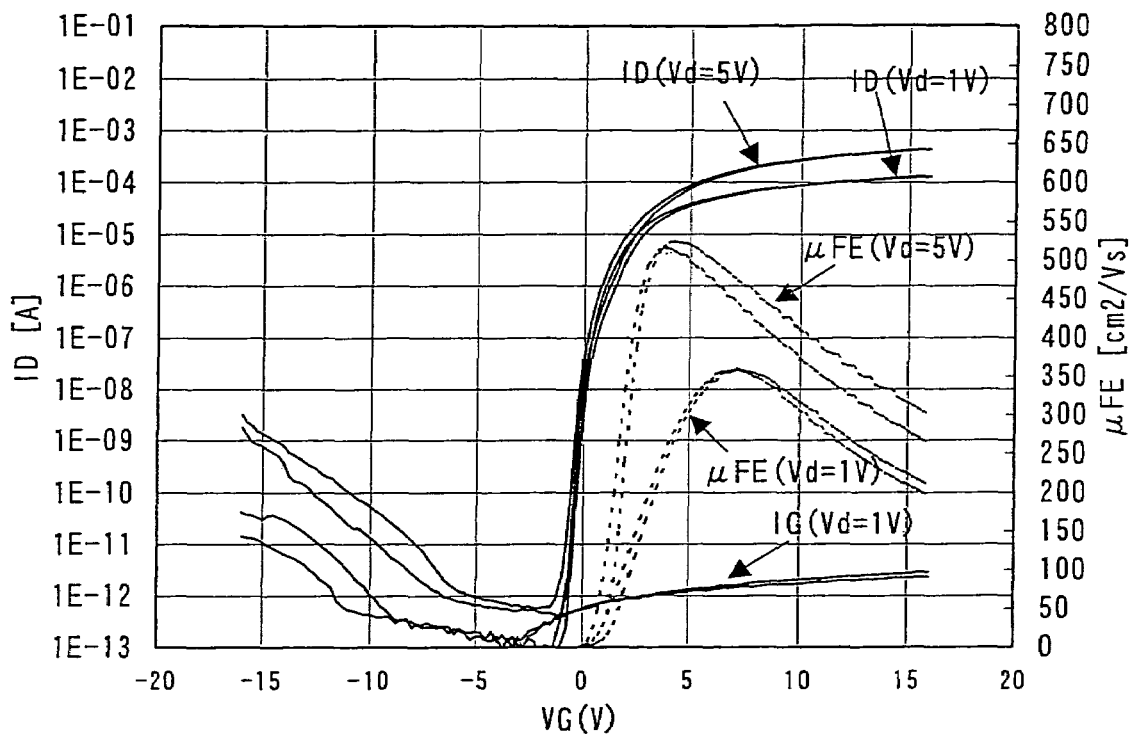
FIGS. 12 and 12B are graphs showing the electrical characteristics of TFTs obtained in accordance with the present invention.
Figure 12B:
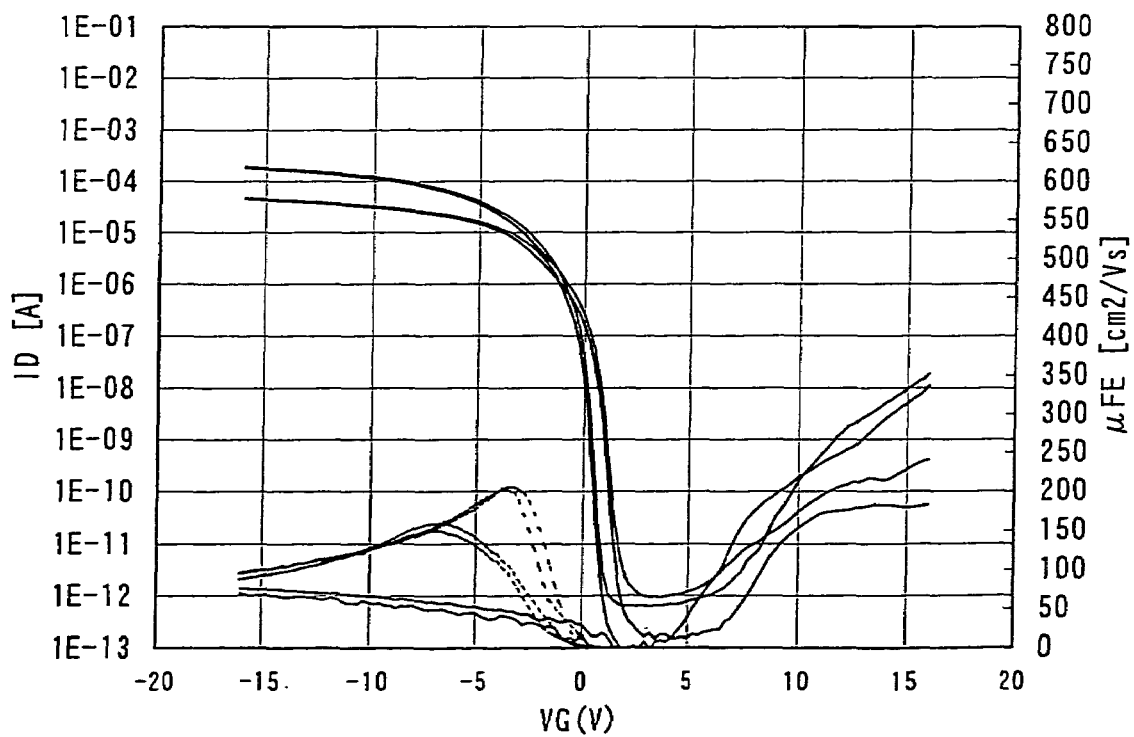

FIGS. 12A and 12B show results of measuring these electrical characteristics. FIG. 12A shows an electric characteristic of the n-channel TFT 51. FIG. 12B shows an electric characteristic of the p-channel TFT 52. The electric characteristics are measured at two measurement points in a range of gate voltage Vg=−16 to 16 V and in the range of drain voltage Vd=1 V and 5 V. In FIGS. 12A and 12B, the drain current (ID) and the gate current (IG) are indicated by solid lines. The mobility (μFE) is indicated by a dotted line.

Because large crystal grains are formed on the semiconductor film crystallized according to the present invention, the number of crystal grain boundaries containing the channel forming region can be reduced when a TFT is manufactured by using the semiconductor film. Furthermore, because the formed crystal grains direct to the same direction, the number of times of crossing the crystal grain boundaries by carriers can be extremely reduced. Therefore, a TFT having the good electric characteristic can be obtained as shown in FIGS. 12A and 12B. Especially, the mobility is 524 cm$^2$/Vs in the n-channel TFT and 205 cm$^2$/Vs in the p-channel TFT. When a semiconductor device and a semiconductor display device are manufactured by using this type of TFT, the operational characteristic and the reliability can be improved also.

Embodiment Mode 8

Figure 13A:
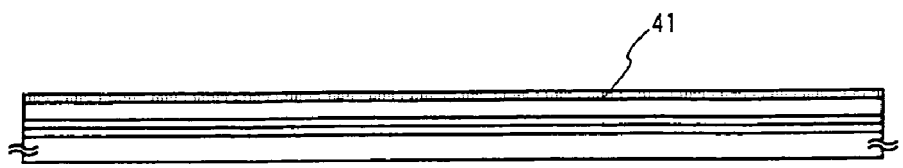
FIGS. 13A to 13C are a process of manufacturing a TFT using a semiconductor film obtained in accordance with the present invention.
Figure 13B:
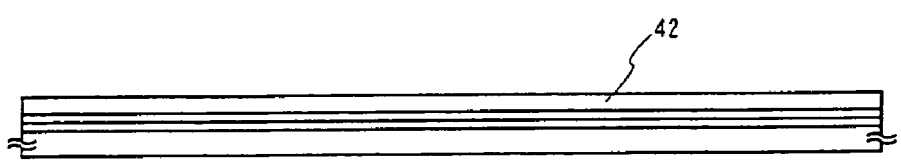

In this embodiment mode, a case where a TFT is manufactured by using a semiconductor film crystallized by using a method which is different from the one shown in Embodiment Mode 7 will be described with reference to FIGS. 13A to 13C, further, electric characteristics of the TFT will be described with reference to FIGS. 14A to 16B.

The steps up to forming the amorphous silicon film as the semiconductor film are the same as Embodiment Mode 7. The amorphous silicon film is formed in 150 nm thick (FIG. 13A).

After that, the method disclosed in the Japanese Patent Application Laid-Open No. Hei 7-183540 is used. Nickel acetate solution (5 ppm in weight conversion concentration and 10 ml in volume) is coated on the semiconductor film by spin coating method to form a metal containing layer 41. Then, thermal processing is performed thereon in a nitrogen atmosphere at 500° C. for one hour and in a nitrogen atmosphere at 550° C. for twelve hours. Then, a semiconductor film 42 is obtained (FIG. 13B).

Then, the crystallinity of the semiconductor film 42 is improved by laser annealing method.

As the laser used for laser annealing method, continuous wave YVO$_4$ laser is used. For the condition for the laser annealing method, the second harmonic (wavelength 532 nm, 5.5 W) of the YVO$_4$ laser is used as laser light. The elliptical beam of 200 μm×50 μm is formed having incident angle φ of about 20° of laser light with respect to the convex lens 703 in the optical system shown in FIG. 7. The elliptical beam is moved and irradiated to the substrate at the speed of 20 cm/s or 50 cm/s. Thus, the crystallinity of the semiconductor film 42 is improved. As a result, a semiconductor film 43 is obtained (FIG. 13C).

Figure 13C:
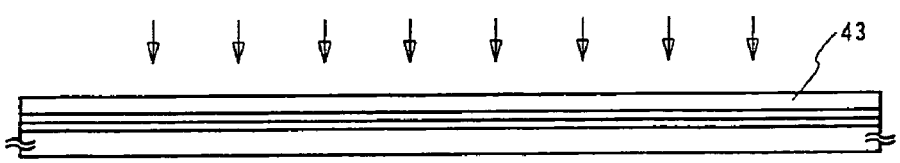

The steps after the crystallizing the semiconductor film in FIG. 13C are the same as the steps shown in FIGS. 11C to 11H shown in Embodiment Mode 7. In this way, the n-channel TFT 51 and the p-channel TFT 52 are formed, both having the channel length of 6 μm and the channel width of 4 μm. These electrical characteristics are measured.

FIGS. 14A to 16B show electric characteristics of the TFT manufactured through these steps.

Figure 14A:
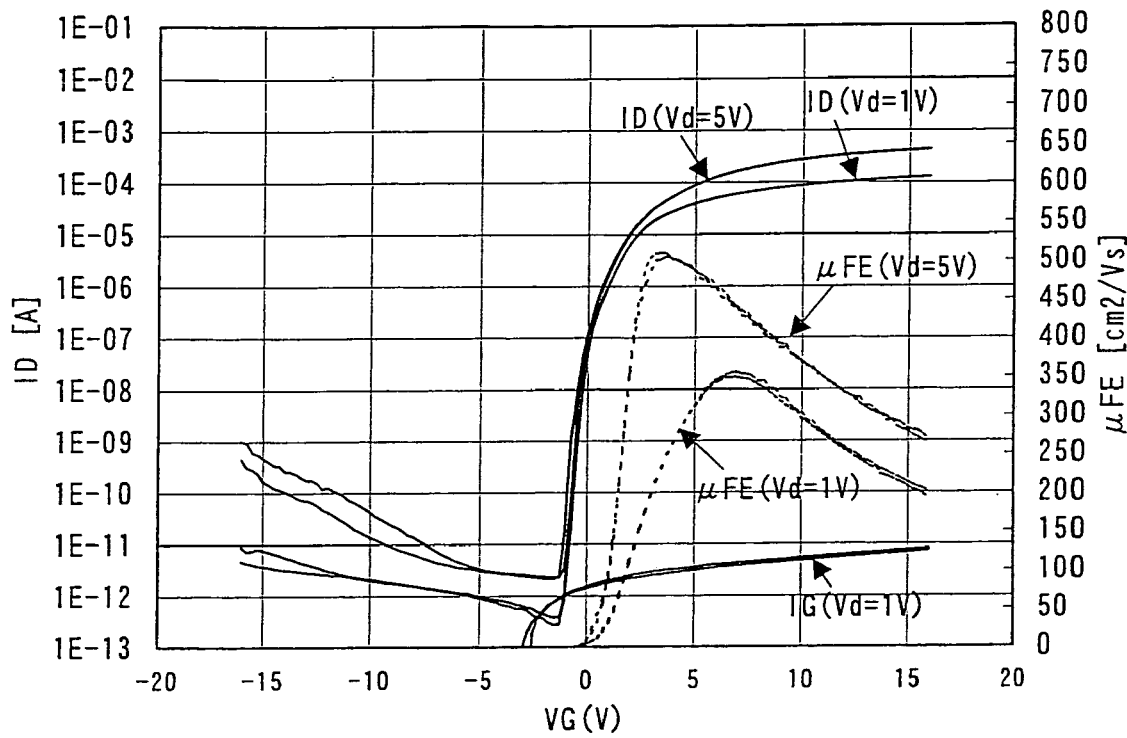
FIGS. 14A and 14B are graphs showing the electrical characteristics of TFTs obtained in accordance with the present invention.
Figure 14B:
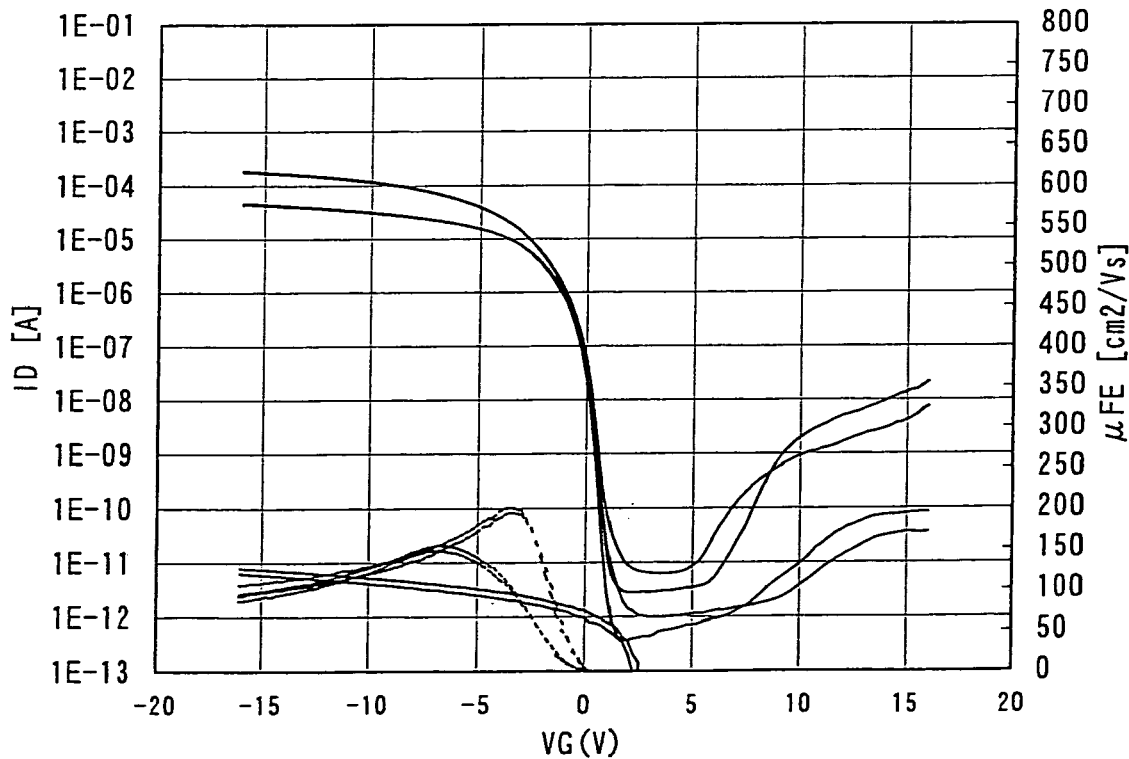
Figure 15A:
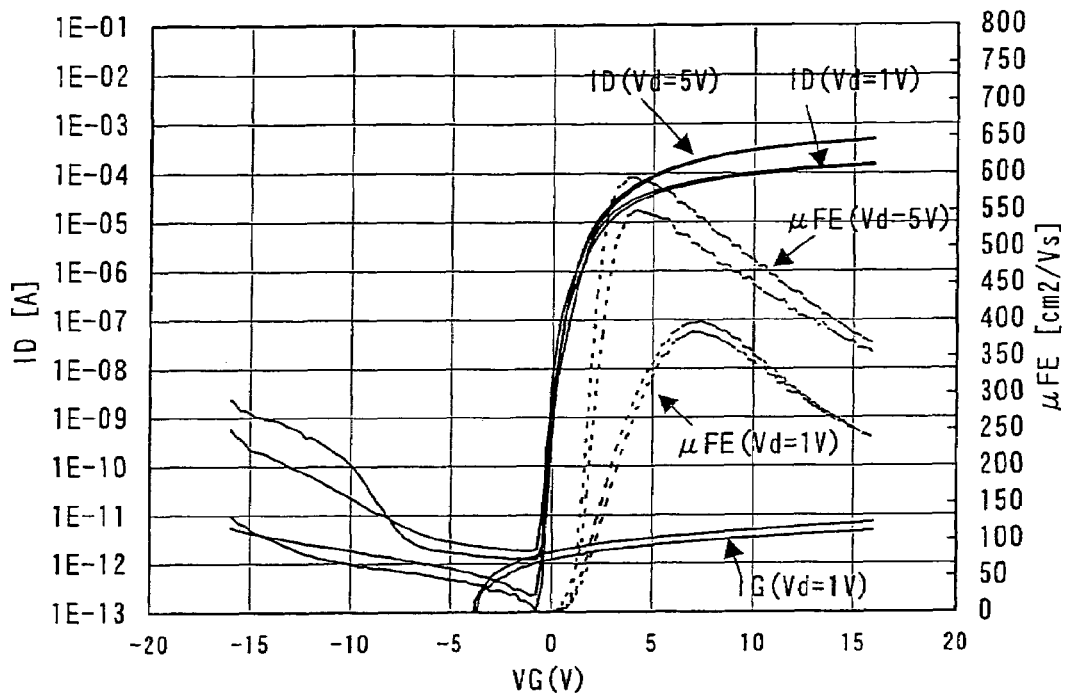
FIGS. 15A and 15B are graphs showing the electrical characteristics of TFTs obtained in accordance with the present invention.
Figure 15B:
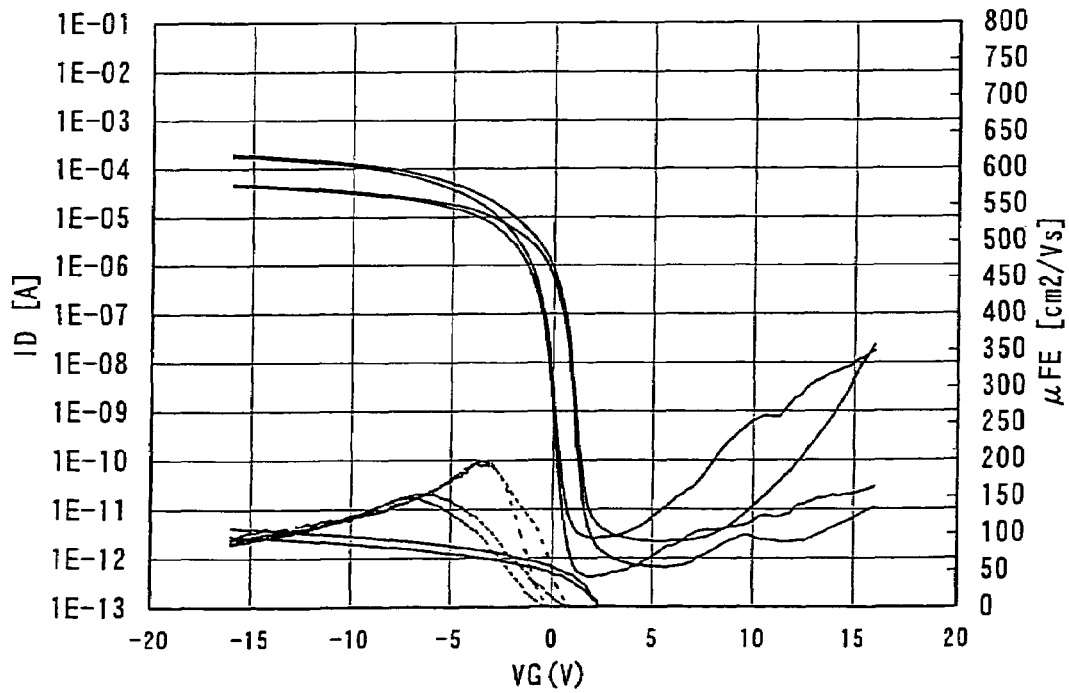

FIGS. 14A and 14B show these electrical characteristics of a TFT manufactured by moving the substrate at the speed of 20 cm/s in the laser annealing step in FIG. 13C. FIG. 14A shows an electric characteristic of the n-channel TFT 51. FIG. 14B shows an electric characteristic of the p-channel TFT 52. FIGS. 15A and 15B show these electrical characteristics of a TFT manufactured by moving the substrate at the speed of 50 cm/s in the laser annealing step in FIG. 13C. FIG. 15A shows an electric characteristic of the n-channel TFT 51. FIG. 15B shows an electric characteristic of the p-channel TFT 52.

The electric characteristics are measured in a range of gate voltage Vg=−16 to 16 V and in the range of drain voltage Vd=1 V and 5 V. In FIGS. 14A to 15B, the drain current (ID) and the gate current (IG) are indicated by solid lines. The mobility (μFE) is indicated by a dotted line.

Because large crystal grains are formed on the semiconductor film crystallized according to the present invention, the number of crystal grain boundaries contained in the channel forming region can be reduced when a TFT is manufactured by using the semiconductor film. Furthermore, the formed crystal grains direct to the same direction. In addition, the small number of grain boundaries is laid in a direction crossing the relative scanning direction of laser light. Therefore, the number of times of crossing the crystal grain boundaries by carriers can be extremely reduced.

Accordingly, a TFT having the good electric characteristic can be obtained as shown in FIGS. 14A to 15B. Especially, the mobility is 510 cm$^2$/Vs in the n-channel TFT and 200 cm$^2$/Vs in the p-channel TFT in FIGS. 14A and 14B. The mobility is 595 cm$^2$/Vs in the n-channel TFT and 199 cm$^2$/Vs in the p-channel TFT in FIGS. 15A and 15B. When a semiconductor device and a semiconductor display device are manufactured by using this type of TFT, the operational characteristic and the reliability can be also improved.

Figure 16A:
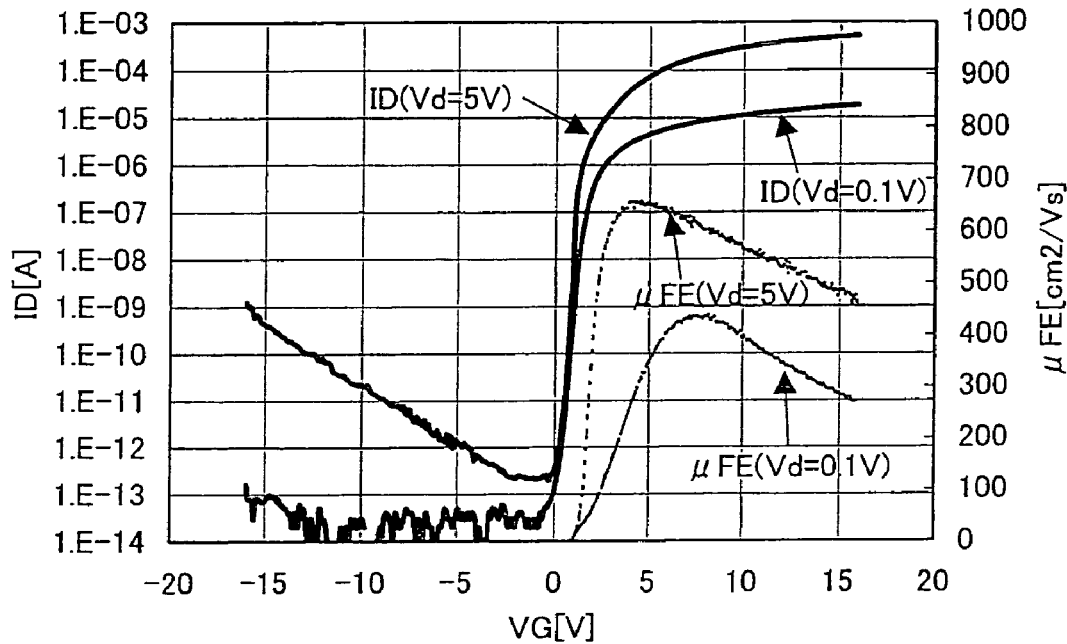
FIGS. 16A and 16B are graphs showing the electrical characteristics of TFTs obtained in accordance with the present invention.
Figure 16B:
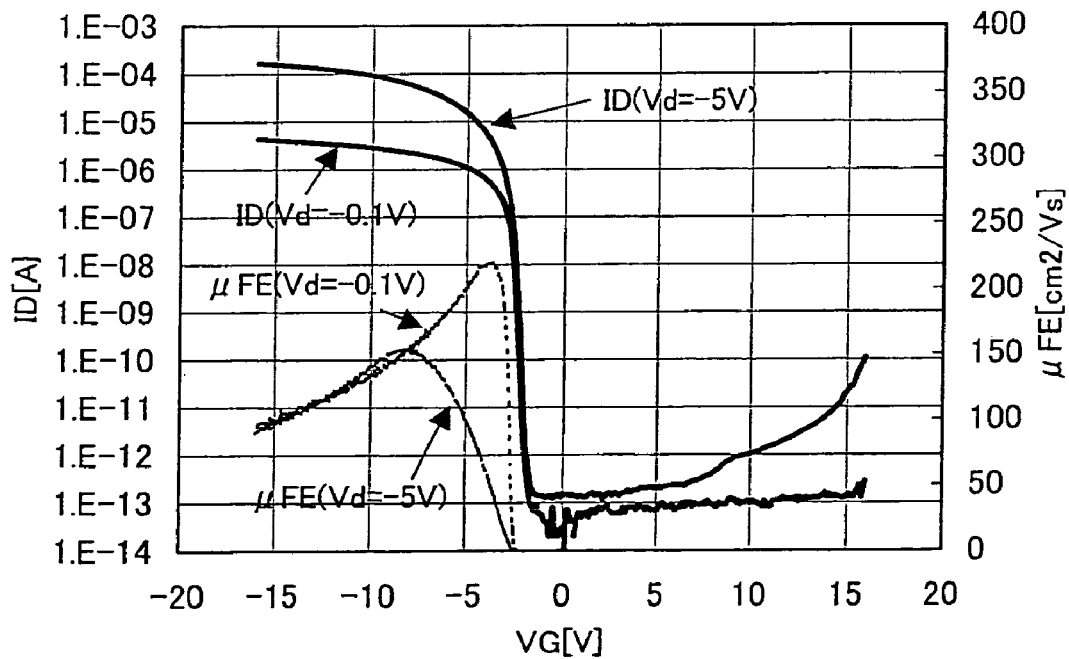

FIGS. 16A and 16B show these electrical characteristics of a TFT which is different from that in FIG. 15 and is manufactured by moving the substrate at the speed of 50 cm/s in the laser annealing step in FIG. 13C. FIG. 16A shows an electric characteristic of the n-channel TFT 51. FIG. 16B shows an electric characteristic of the p-channel TFT 52.

The electric characteristics are measured in a range of gate voltage Vg=−16 to 16 V and in the range of drain voltage Vd=0.1 V and 5 V.

As shown in FIGS. 16A and 16B, a TFT having the good electric characteristic can be obtained. Especially, the mobility is 657 cm$^2$/Vs in the n-channel TFT in FIG. 16A and 219 cm$^2$/Vs in the p-channel TFT in FIG. 16B. When a semiconductor device and a semiconductor display device are manufactured by using this type of TFT, the operational characteristic and the reliability can be also improved.

Embodiment Mode 9

Figure 17:
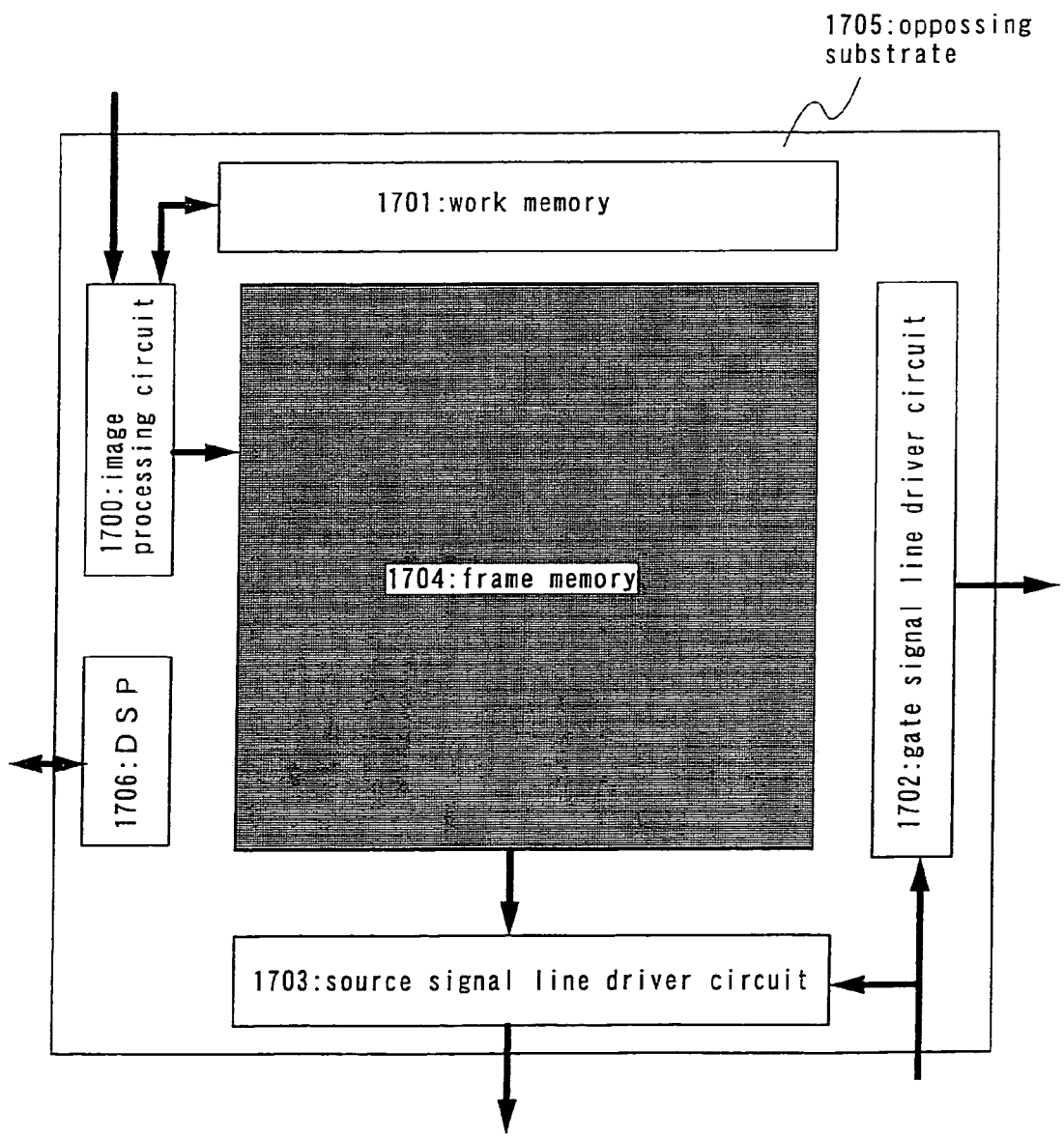
FIG. 17 is a block diagram showing an example of a semiconductor device having a display portion of the present invention.

FIG. 17 is a diagram showing an example of a semiconductor device having an active matrix display portion in which logic circuits are formed on an opposing substrate 1705.

Operation of the semiconductor device having a display portion shown in FIG. 17, namely operation of a semiconductor display device, is explained. An image processing circuit 1700, a working memory 1701, a gate signal line driver circuit 1702, a source signal line driver circuit 1703, a frame memory 1704, and a DSP (digital signal processor) 1706 are shown formed on the opposing substrate 1705 in FIG. 17. Image data processing is then performed by an image processing circuit on data received from external devices through an interface circuit. The DSP 1706 performs digital signal processing. The image processing circuit 1700 performs data reading and writing at any time with the working memory 1701, which is a temporary data storage location when making control signals or image data. In addition, the image processing circuit 1700 accesses the frame memory 1704 two dimensionally and writes in image data that must be displayed in a display. The image data written into the frame memory 1704 is displayed in pixels by the gate signal line driver circuit 1702 and the source signal line driver circuit 1703.

The DSP 1706 and the image processing circuit 1700 can achieve an operating speed equal to or greater than 5 MHz in Embodiment Mode 9 by manufacturing TFTs on the opposing substrate 1705 using a semiconductor film formed by the methods shown in Embodiment Modes 5 to 8. Further, SRAMs and DRAMs are used as the working memory 1701 and the frame memory 1704, and a read out cycle time equal to, or less than, 200 nsec is achieved for the SRAM, while a read out cycle time equal to, or less than, 1 μsec is achieved for the DRAM.

Note that a portion of the logic circuits may be mounted by external attachment.

Note that it is possible to implement Embodiment Mode 9 by combining it with any one of Embodiment Modes 1 to 4.

Embodiment Mode 10

Figure 18:
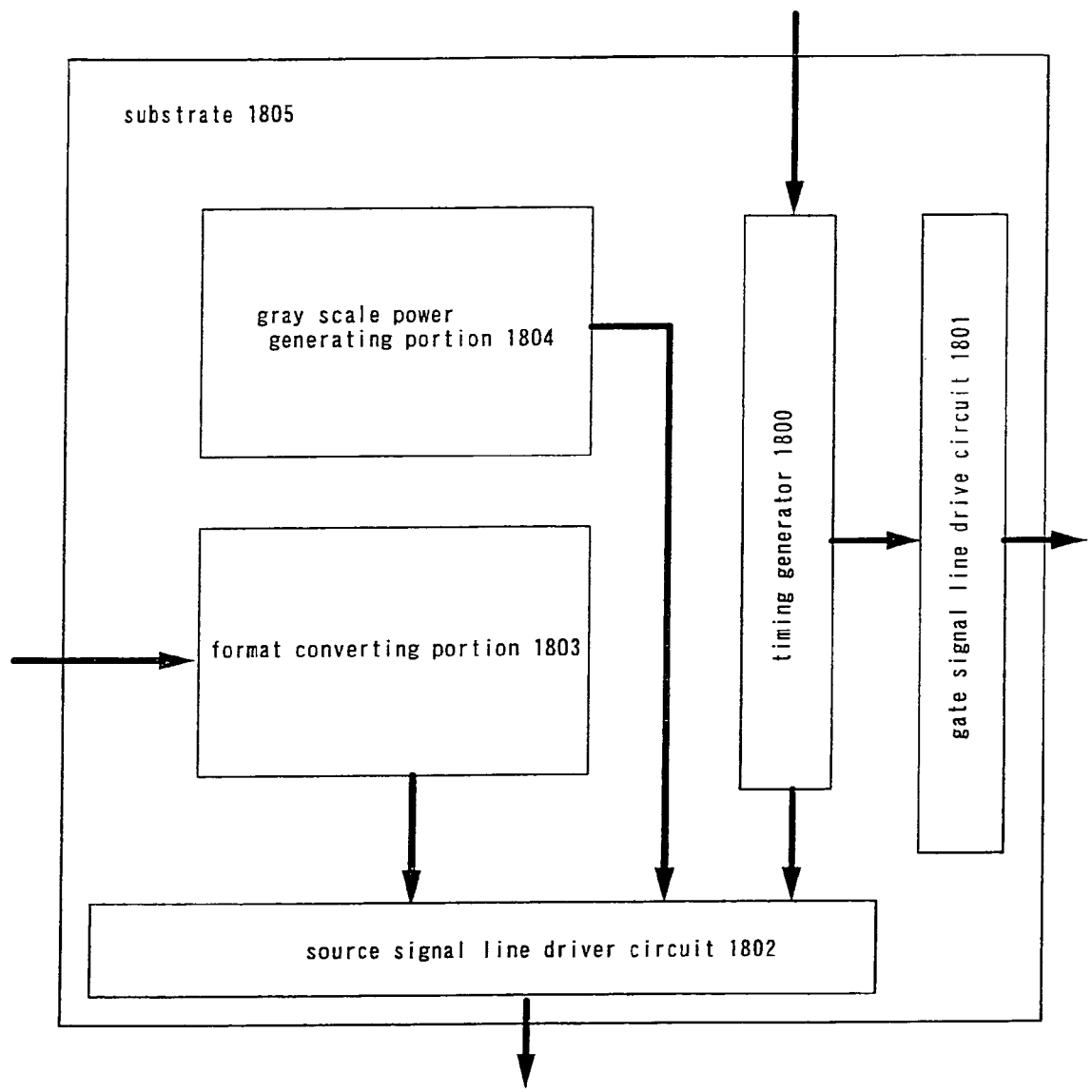
FIG. 18 is a block diagram showing an example of a semiconductor device having a display portion of the present invention.

FIG. 18 is a diagram showing an example of a semiconductor device having an active matrix display portion in which logic circuits are formed on an opposing substrate 1805.

Operation of a semiconductor device having a display portion shown in FIG. 18 is explained. Clock signals for determining the operation timing of a gate signal line driver circuit 1801 and a source signal line driver circuit 1802 are generated by a timing generator circuit 1800. A voltage for determining a gray scale reference is output by a gray scale electric power source generator portion 1804. Image processing such as expansion and decoding of an input signal that has been compressed and encoded, image interpolation, and resizing is performed by a format conversion portion 1803. The format converted image data is displayed in a screen by the gate signal line driver circuit 1801 and the source signal line driver circuit 1802.

Note that a portion of the logic circuits may be mounted by external attachment.

Note that logic circuit TFTs of Embodiment Mode 10 may be manufactured in accordance with the methods discussed in Embodiment Mode 5 to 8. Further, it is possible to implement the logic circuit of Embodiment Mode 10 in combination with Embodiment Modes 1 to 4.

Embodiment Mode 11

Figure 19:
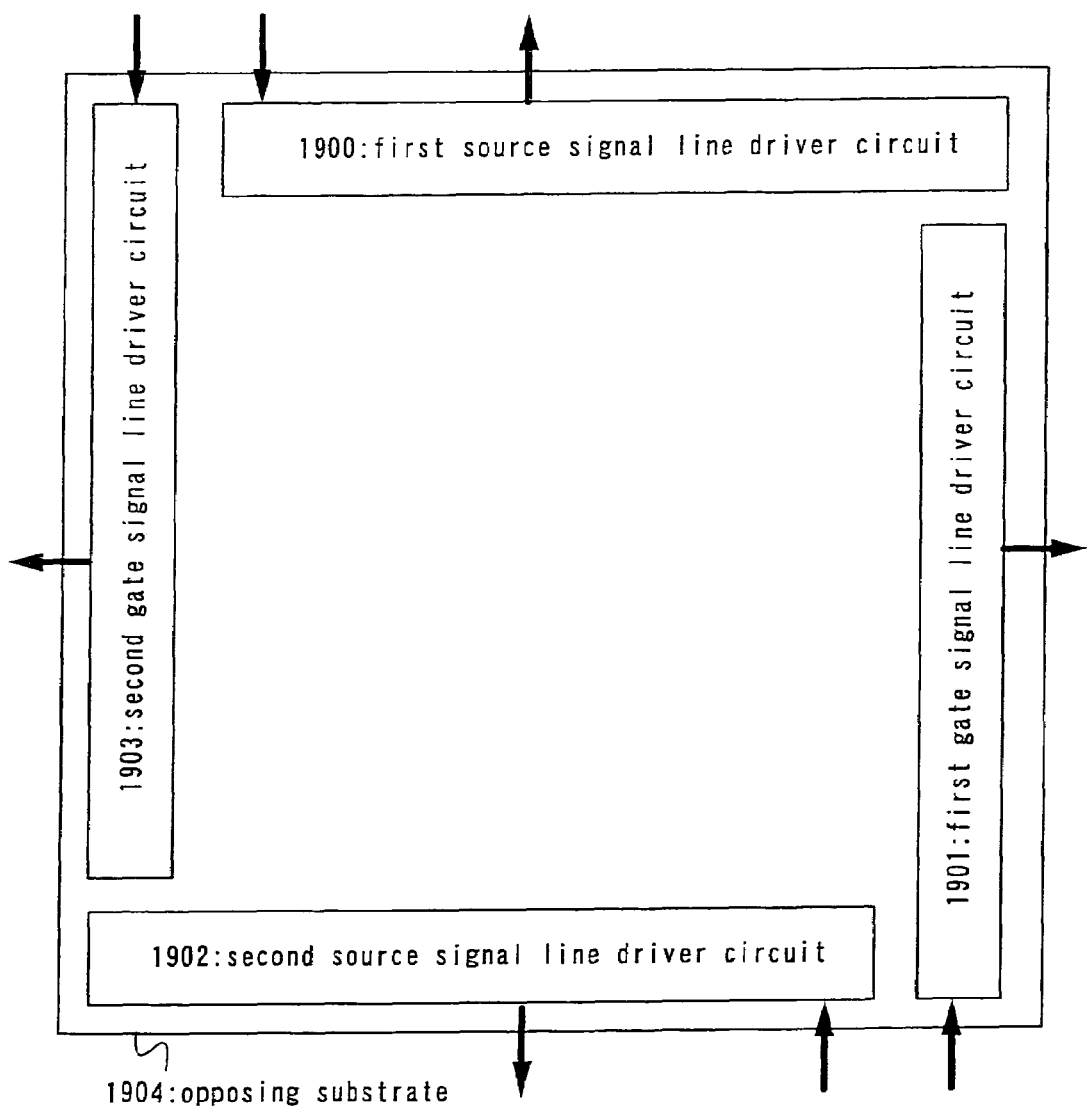
FIG. 19 is a block diagram showing an example of a semiconductor device having a display portion of the present invention.

FIG. 19 is a diagram showing an example of a semiconductor device having an active matrix display portion in which a first gate signal line driver circuit 1901, a second gate signal line driver circuit 1903, a first source signal line driver circuit 1900, and a second source signal line driver circuit 1902 are formed on an opposing substrate 1904 so as to follow four sides of the substrate. The first gate signal line driver circuit and the first source signal line driver circuit perform display of a background image in Embodiment Mode 11, and the second gate signal line driver circuit and the second source signal line driver circuit perform display of a text mode independently from the background image display.

Note that the number of driver circuit divisions and the method of arranging them are not limited to the aforementioned method. Further, a portion of the driver circuits may also be mounted externally.

Note that logic circuit TFTs of Embodiment Mode 11 may be manufactured in accordance with the methods discussed in Embodiment Mode 5 to 8. Further, it is possible to implement the logic circuit of Embodiment Mode 11 in combination with Embodiment Modes 1 to 4.

Embodiment Mode 12

Figure 20:
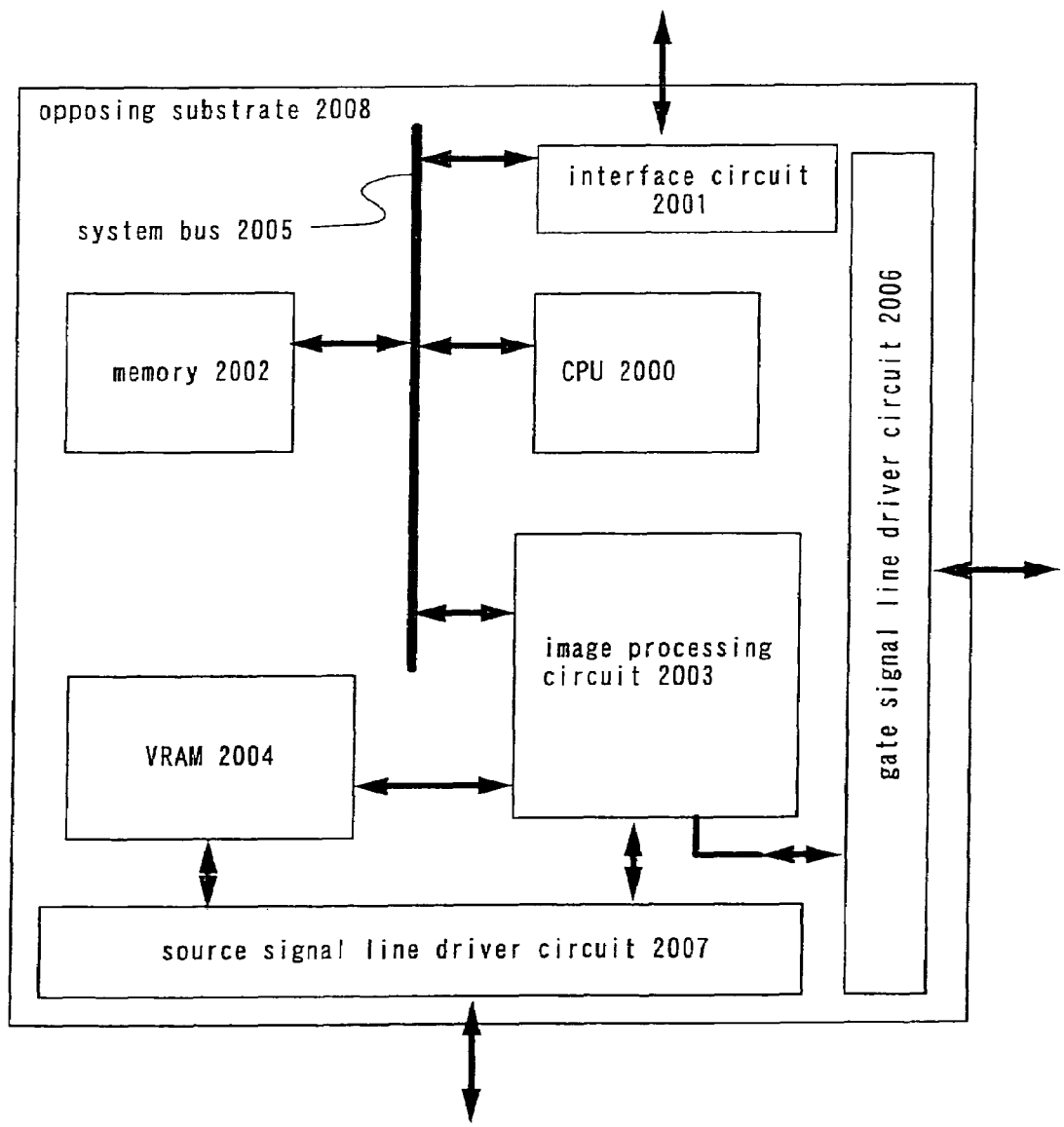
FIG. 20 is a block diagram showing an example of a semiconductor device having a display portion of the present invention.

FIG. 20 shows a block diagram of a logic circuit formed on an opposing substrate 2008 in a display portion of a portable game machine utilizing the display device of the present invention.

Operation of the semiconductor device having the display portion shown in FIG. 20 is explained. Data is send to a system bus 2005 from an external device not arranged on the opposing substrate 2008, through an interface circuit 2001. ROMs, keyboards, and the like can be given as examples of the external device. Communication with the external device is controlled by a CPU 2000. Data is stored in a memory 2002 via the system bus 2005. In addition, the data is undergoes image processing by an image processing circuit 2003, and is stored in a VRAM 2004. The image data stored in the VRAM 2004 is displayed as an image by a gate signal line driver circuit 2006 and a source signal line driver circuit 2007.

The CPU 2000 can achieve an operating speed equal to or greater than 5 MHz in Embodiment Mode 12 by manufacturing TFTs on the opposing substrate 2008 using a semiconductor film formed by the methods shown in Embodiment Modes 5 to 8. Further, SRAMs and DRAMs are used as the memory 2002 and the VRAM 2004, and a read out cycle time equal to, or less than, 200 nsec is achieved for the SRAM, while a read out cycle time equal to, or less than, 1 μsec is achieved for the DRAM.

Note that a portion of the logic circuits may be mounted by external attachment.

Note that, it is possible to implement the logic circuit of Embodiment Mode 12 in combination with Embodiment Modes 1 to 4.

Embodiment Mode 13

Examples of electronic apparatuses to which the present invention is applied include a video camera, a digital camera, a goggle type display (head-mounted display), a navigation system, a sound reproducing system (car audio system, audio component stereo, or the like), a notebook personal computer, a game player, a portable information terminal (mobile computer, portable telephone, portable game player, electronic book, or the like), and an image reproducing system provided with a recording medium (specifically, device which plays a recording medium such as a digital versatile disc (DVD) and is provided with a display for displaying images). Specific examples of the electronic devices are shown in FIGS. 21A to 21G.

Figure 21A:
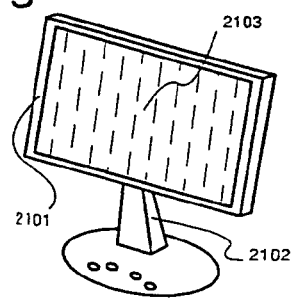
FIG. 21A to 21G are diagrams showing electronic equipment using a semiconductor device having a display portion of the present invention.

FIG. 21A shows a display device, which includes a casing 2101, a support stand 2102, and a display portion 2103. The present invention can be applied to the display portion 2103.

Figure 21B:
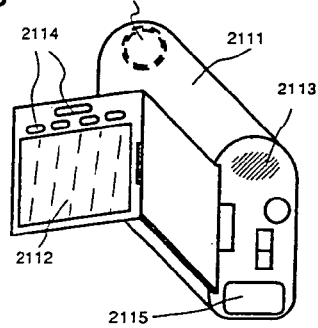

FIG. 21B shows a video camera, which is constituted by a main body 2111, a display portion 2112, a sound input portion 2113, operation switches 2114, a battery 2115, an image receiving portion 2116, and the like. The present invention can be applied to the display portion 2112.

Figure 21C:
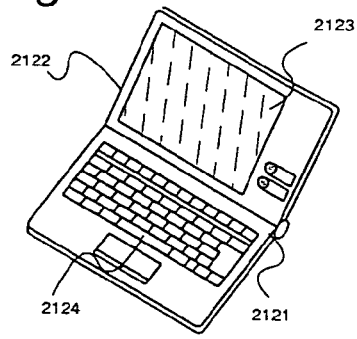

FIG. 21C shows a notebook personal computer, which is constituted by a main body 2121, a casing 2122, a display portion 2123, a keyboard 2124, and the like. The present invention can be applied to the display portion 2123.

Figure 21D:
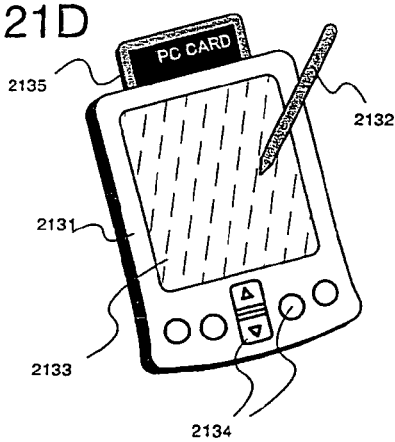

FIG. 21D shows a portable information terminal, which is constituted by a main body 2131, a stylus 2132, a display portion 2133, operation buttons 2134, an external interface 2135, and the like. The present invention can be applied to the display portion 2133.

Figure 21E:
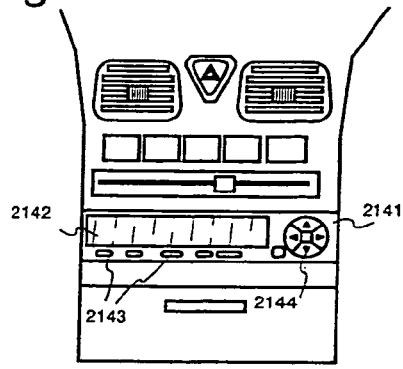

FIG. 21E shows a sound reproducing system, specifically, an audio system for an automobile, which is constituted by a main body 2141, a display portion 2142, operation switches 2143 and 2144, and the like. The present invention can be applied to the display portion 2142. Further, the audio system for an automobile is taken as an example here, but a portable or domestic audio system may be given.

Figure 21G:
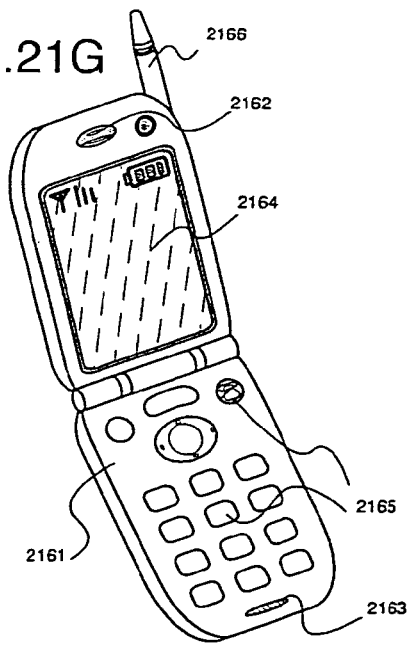
Figure 21F:
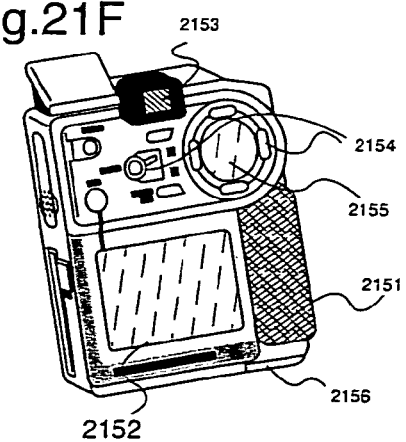

FIG. 21F shows a digital camera, which is constituted by a main body 2151, a display portion A 2152, an eyepiece portion 2153, operation switches 2154, a display portion B 2155, a battery 2156, and the like. The present invention can be applied to the display portion A 2152 and the display portion B 2155.

FIG. 21G shows a portable telephone, which is constituted by a main body 2161, a sound output portion 2162, a sound input portion 2163, a display portion 2164, operation switches 2165, an antenna 2166, and the like. The present invention can be applied to the display portion 2164.

Not only a glass substrate but also a heat-resistance plastic substrate can be used for the display device used in each of the above electronic devices. Thus, reduction in weight of the electronic device can be attained.

In addition, the apparatuses shown in this embodiment mode are just examples, the present invention is not limited to these examples.

This embodiment mode can be performed by freely combining with the manufacturing methods of the TFTs and the logic circuit described in Embodiment Modes 1 to 12.

Embodiment Mode 14

A case of forming a pixel portion, a source signal line driver circuit, and a gate signal line driver circuit integrally on a pixel substrate, and forming a logic circuit on an opposing circuit is explained in Embodiment Mode 14.

A pixel portion 501, a source signal line driver circuit 502, and a gate signal line driver circuit 503 are formed on a pixel substrate 500 in FIG. 22A (hereinafter the source signal line driver circuit and the gate signal line driver circuit are referred to as driver circuits). Further, a CPU 506 is formed on an opposing substrate 505 as an example of the logic circuit.

Further, TFTs are formed for each pixel at which source lines and gate lines intersect, and for the source signal line driver circuit 502, the gate signal line driver circuit 503, and the CPU 505 in the pixel portion 501. The TFTs may be manufactured by referring to Embodiment Modes 4 to 13.

Note that although a liquid crystal layer is formed between the pixel substrate 500 and the opposing substrate 505, it is not shown in the figures for convenience of explanation.

The driver circuits and the CPU are then connected by a wire bonding method using wirings 508, through electric pads 507 formed thereon. The plurality of electric pads 507 formed on the CPU and the driver circuits are formed in opening portions (on the order of 100 μm×100 μm) in a passivation film formed in order to protect the TFTs. Further, the passivation film may be formed from an organic resin material such as SiN, SiN/TEOS in which TEOS is mixed in to relieve the internal stress of SiN, or acrylic.

Figure 22A:
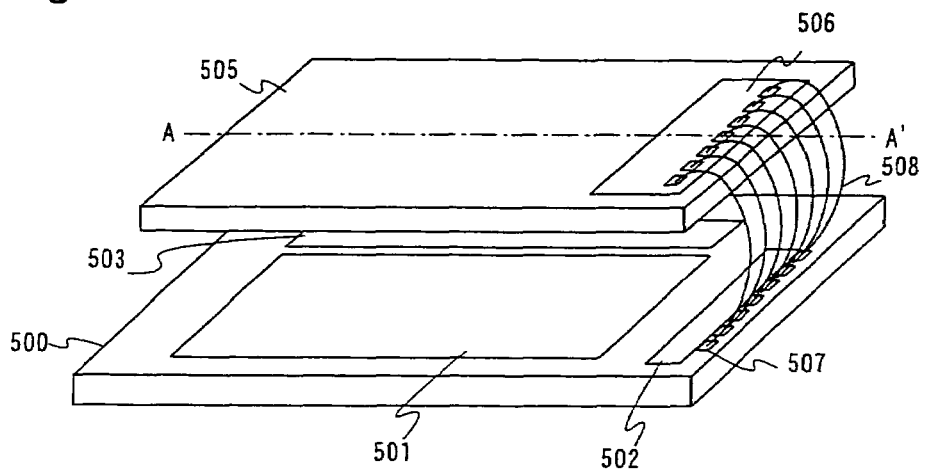
FIGS. 22A and 22B are diagrams showing a semiconductor device having an active matrix display portion of the present invention.
Figure 22B:
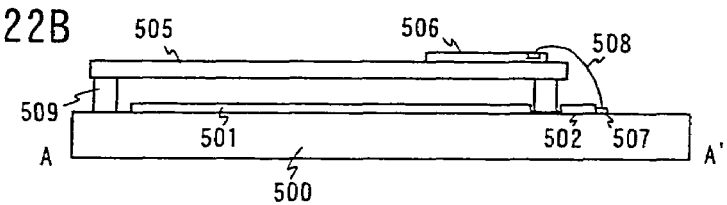

A cross sectional diagram of FIG. 22A taken along a line segment A-A' is shown in FIG. 22B. The pixel substrate 500 and the opposing substrate 505 are bonded in FIG. 22B, and a sealing agent 509 is provided in order to fix the two together. Note that the sealing agent 509 also serves as spacers in order to maintain a space (gap) between the pixel substrate and the opposing substrate. Suitable column shape spacers or ball shape spacers may of course also be used. Further, the sealing agent 509 may be provided so as to cover a portion of a pixel portion and a portion of a driver circuit, and may be formed on the driver circuit. However, in this case it is necessary to dispose the sealing agent while taking into consideration stress on the pixel portion and the driver circuit caused by the sealing agent and the like.

In addition, the height of the CPU is on the same order as that of the spacer, and therefore the CPU may be formed on the location for providing the sealing agent 509 and thus made to function as a spacer. In this case the CPU may be formed in a region (side) for forming the driver circuit, and the sealing agent may be provided in other regions (other sides) of the substrate. Further, the driver circuits and the CPU may also be connected using a conductive paste or the like.

The present invention thus described has the pixel portion 501, the source signal line driver circuit 502, the gate signal line driver circuit 503, and the CPU 505 formed on different substrates based on their different driver voltages.

In addition, it becomes possible to form the TFTs by using different processes on the pixel substrate and the opposing substrate.

For example, it is necessary that the TFTs used in the CPU have high mobility for electrical characteristics, and therefore a crystallization process in which a laser or a metallic element for promoting crystallization is used, and in addition, a crystallization process in which both are combined may be employed for the TFTs on the opposing substrate. On the other hand, although it is necessary for the TFTs on the pixel substrate to have high mobility, compared to the CPU, the TFT mobility may be lower.

Further, since the CPU requires high speed operation, a value of the driver voltage must be lowered and a gate insulating film must therefore be made thin. However, it has been difficult to make the driver voltage lower voltage and make the gate insulating film thinner by restricting the driver voltage of the display device by the TFTs and the like used in the pixel portion.

With the present invention, TFTs requiring different characteristics as described above are manufactured and formed on different substrates.

Figure 23A:
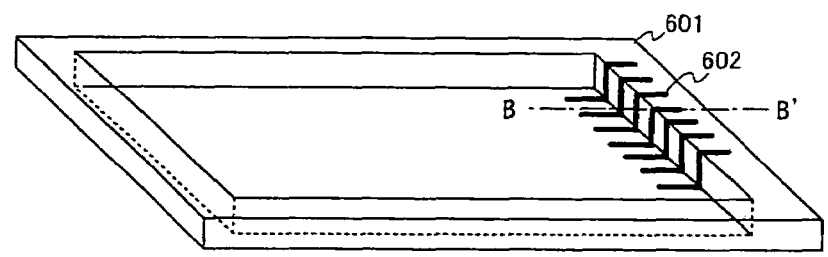
FIGS. 23A and 23B are diagrams showing a semiconductor device having an active matrix display portion of the present invention.
Figure 23B:
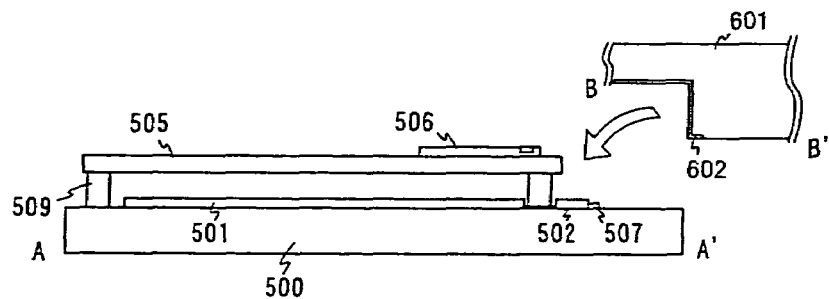

An example of a connecting method differing from that of FIG. 22B is shown in FIGS. 23A and 23B.

Wirings 602 are formed in advance in an external frame of the semiconductor device (generally a frame formed by a resin or the like) 601 as shown in FIG. 23A. The wirings 602 can be obtained by forming grooves in the external frame 601, and then forming lead wirings in the grooves. Further, it is also possible to form the wirings by printing a conductive substance like a printed substrate. In addition, an insulating film may also be printed on the wirings formed by printing, excluding a connection portion for connecting to electric pads. It is preferable that the gap between wirings be equal to the gap between electric pads. Further, it is also possible to draw wirings similar to a printed substrate and mount other semiconductor elements.

The pixel substrate 501 and the opposing substrate 505, fixed together by a sealing agent, are then fit into the external frame 601, and the electric pads for the driver circuit and the electric pads for the CPU are connected with each other. Forming wirings in the external frame is simpler than connecting each of the electric pads by a wire bonding method, and in addition, connection defects can be reduced. In addition to the connection method shown in FIGS. 23A and 23B, the opening portions and the electric pads may also be connected in a manner of a printed circuit or sockets.

Embodiment Mode 14 is not limited to a reflective liquid crystal display device in which a CPU is formed on a driver circuit, that is outside of a pixel region, and a sealant region is formed. It is therefore possible to manufacture a transmitting liquid crystal display device other than a reflective crystal display device.

The semiconductor device and the semiconductor display device of the present invention thus have logic circuits, conventionally formed on a substrate differing from a substrate structuring a pixel portion, formed on an opposing substrate by manufacturing TFTs on the opposing substrate. As a result, a small size semiconductor device and a small size semiconductor display device can be achieved, it becomes possible to greatly simplify the mounting of IC chips and the like, and reliability can be increased from the standpoint of mounting.

TFTs are formed on an opposing substrate and a logic circuit is manufactured on the opposing substrate in an active matrix semiconductor display device and a semiconductor device with the present invention. A control portion made from the logic circuit is thus integrated with a display portion, and a semiconductor display system having small size is achieved. Further, the mounting of an IC substrate other than the pixel substrate and the mounting of an FPC when making electrical connections between substrates become unnecessary, and therefore problems relating to mounting are resolved.

What is claimed is:

1. A method of manufacturing an active matrix display device, comprising:
    forming a pixel region, a source signal line driver circuit, and a gate signal line driver circuit, each comprising a plurality of transistors formed over a first substrate;
    forming a logic circuit comprising a plurality of transistors over a second substrate; and
    connecting the logic circuit to at least one of the gate signal line driver circuit and the source signal line driver circuit by using a wire bonding method.

2. A method of manufacturing a display device, comprising:
    forming a pixel region over a first substrate;
    forming a circuit comprising a thin film transistor over a second substrate;
    disposing the second substrate so as to be opposed to the first substrate; and
    operationally connecting the circuit with said pixel region through a wiring.

3. The method according to claim 2 further comprising a step of disposing a liquid crystal material between the first and second substrates.

4. The method according to claim 2 wherein said second substrate is disposed so that said circuit is located between said first and second substrates.

5. The method according to claim 2 wherein said second substrate is disposed so that said circuit is located at a side of said second substrate opposite to said first substrate.

6. The method according to claim 2 wherein said pixel region comprises thin film transistors.

7. A method of manufacturing a display device, comprising:
    forming a pixel region and a first driver circuit for driving said pixel region over a first substrate, each of said pixel region and said first driver circuit comprising a first thin film transistor;
    forming a second circuit comprising a second thin film transistor over a second substrate;
    disposing the second substrate so as to be opposed to the first substrate; and
    operationally connecting the second circuit with said pixel region through a wiring.

8. The method according to claim 7 further comprising a step of disposing a liquid crystal material between the first and second substrates.

9. The method according to claim 7 wherein said second substrate is disposed so that said second circuit is located between said first and second substrates.

10. The method according to claim 7 wherein said second substrate is disposed so that said second circuit is located at a side of said second substrate opposite to said first substrate.

11. The method according to claim 7 wherein said second circuit comprises at least one of a gate signal line driver circuit and a source signal line driver circuit.

12. A method of manufacturing a display device, comprising:
    forming a pixel region and a first driver circuit for driving said pixel region over a first substrate, each of said pixel region and said first driver circuit comprising a first thin film transistor;
    forming a second circuit comprising a second thin film transistor over a second substrate, said second circuit comprising at least one of an SRAM, a DRAM, a frame memory, a timing generating circuit, an image processing circuit, a CPU, a DSP, and a mask ROM;
    disposing the second substrate so as to be opposed to the first substrate; and
    operationally connecting the second circuit with said pixel region through a wiring.

13. The method according to claim 12 further comprising a step of disposing a liquid crystal material between the first and second substrates.

14. The method according to claim 12 wherein said second substrate is disposed so that said second circuit is located between said first and second substrates.

15. The method according to claim 12 wherein said second substrate is disposed so that said second circuit is located at a side of said second substrate opposite to said first substrate.

16. The method according to claim 12 wherein said first driver circuit comprises at least one of a gate signal line driver circuit and a source signal line driver circuit.

* * * * *